US006436558B1

(12) United States Patent
Sato et al.

(10) Patent No.: US 6,436,558 B1
(45) Date of Patent: Aug. 20, 2002

(54) ORGANIC ELECTROLUMINESCENCE ELEMENT

(75) Inventors: Tadahisa Sato, Kanagawa; Shintaro Hara, Osaka; Akira Gyoutoku, Osaka; Hideaki Iwanaga, Osaka; Takahiro Komatsu, Osaka, all of (JP)

(73) Assignees: Fuji Photo Film Co., Ltd., Kanagawa; Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/253,697

(22) Filed: Feb. 22, 1999

(30) Foreign Application Priority Data

Aug. 7, 1998 (JP) ............................................. 10-224607

(51) Int. Cl.$^7$ ............................................... H05B 33/12
(52) U.S. Cl. ........................ 428/690; 428/704; 428/917; 313/504; 313/506
(58) Field of Search ................................ 428/690, 704, 428/917; 313/504, 506

(56) References Cited

U.S. PATENT DOCUMENTS

| | | | | |
|---|---|---|---|---|
| 5,281,489 A | * | 1/1994 | Mori et al. ................. | 428/690 |
| 5,645,948 A | * | 7/1997 | Shi et al. ..................... | 428/690 |
| 5,766,779 A | * | 6/1998 | Shi et al. ..................... | 428/690 |
| 5,891,587 A | * | 4/1999 | Hu et al. ..................... | 428/690 |
| 5,929,235 A | * | 7/1999 | Sato ........................... | 540/576 |
| 6,150,043 A | * | 11/2000 | Thompson et al. ......... | 428/690 |
| 6,171,715 B1 | * | 1/2001 | Sato et al. .................. | 428/690 |
| 6,242,115 B1 | * | 6/2001 | Thomson et al. ........... | 428/690 |

FOREIGN PATENT DOCUMENTS

WO  WO99/20081  4/1999  ........... H05B/33/26

OTHER PUBLICATIONS

C. W. Tang and S. A. VanSlyke, Appl. Phys. Lett., vol. 51, No. 12, Sep. 21, 1987, pp. 913–915, "Organic electroluminescent diodes".

* cited by examiner

Primary Examiner—Marie Yamnitzky
(74) Attorney, Agent, or Firm—Sughrue Mion, PLLC

(57) ABSTRACT

An organic electroluminescence element comprising a substrate having provided thereon an anode for injecting holes, a cathode for injecting electrons, and at least one organic compound layer therebetween, wherein the organic compound layer contains at least one compound represented by formula (I), and at least one compound represented by formula (II), (III) or (IV) (definitions of formulas (I) to (IV) are described in the specification).

7 Claims, 1 Drawing Sheet

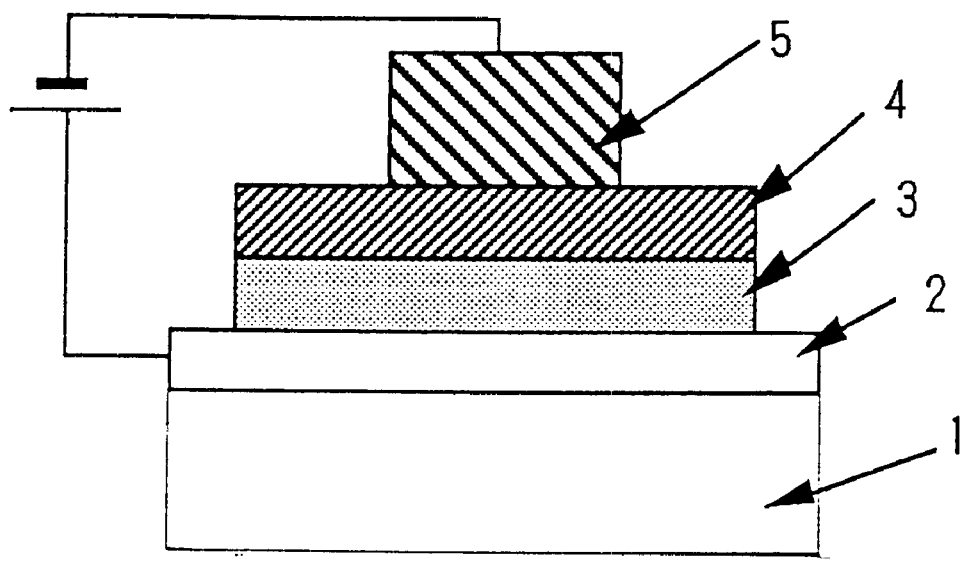

ORGANIC ELECTROLUMINESCENCE ELEMENT

FIELD OF THE INVENTION

The present invention relates to an organic electroluminescence element which is used as a luminescent element and the like for use in various display units, light sources or back lights of display units, and optical communication devices.

BACKGROUND OF THE INVENTION

An electroluminescence element is a luminescent device making use of electroluminescence of a solid fluorescent material. Inorganic electroluminescence elements using inorganic materials as an illuminant have been now put to practical use, and the application to a back light of a liquid display and a flat display is devised in some parts, but as the voltage necessary for the luminescence of an inorganic electroluminescence element is high such as 100 V or more and, moreover, blue luminescence is difficult, realization of full colors by three primary colors of RGB is difficult.

On the other hand, studies concerning electroluminescence elements using organic materials have so far attracted public attention and various examinations have been done but did not develop into full-scale practical studies because the luminous efficacy was extremely bad. However, an organic electroluminescence element having a function-separating type laminate structure in which an organic material is divided into two layers of a hole-transporting layer and a luminescent layer was suggested by C. W. Tang, et al. of Eastman Kodak Co. in 1987, by which it became apparent that high luminant brightness of 1,000 $cd/m^2$ or more can be obtained even by low voltage of 10 V or less (see C. W. Tang and S. A. Vanslyke, *Appl. Phys. Lett.*, 51, 913 (1987)). On and after that time, organic electroluminescence elements have abruptly attracted public attention and similar organic electroluminescence elements having function-separating type laminate structure are eagerly studied even now.

A conventionally used organic electroluminescence element is explained below with referring to the figure. The figure is a constitution drawing of an organic electroluminescence element which has so far been used. In the figure, symbol 1 is a substrate, 2 the anode, 3 a hole-transporting layer, 4 a luminescent layer, and 5 the cathode. As shown in the figure, a conventional organic electroluminescence element comprises transparent or translucent substrate 1 comprising, e.g., glass, anode 2 comprising a transparent electrically conductive film such as ITO, etc., having provided on substrate 1 by a sputtering method or vapor deposition with resistance heating, etc., hole-transporting layer 3 comprising, e.g., N,N'-diphenyl-N,N'-bis(3-methylphenyl)-1,1'-diphenyl-4,4'-diamine (hereinafter referred to as "TPD") having provided on anode 2 by vapor deposition with resistance heating, etc., luminescent layer 4 comprising 8-hydroxyquinoline aluminum (hereinafter referred to as "Alq") having provided on hole-transporting layer 3 by vapor deposition with resistance heating, etc., and cathode 5 comprising a metal film having a film thickness of from 100 nm to 300 nm having provided on luminescent layer 4 by vapor deposition with resistance heating, etc.

When a direct current electric pressure or a direct current electric current is applied to the organic electroluminescence element having the above-described constitution with making anode 2 a positive electrode and cathode 5 a negative electrode, holes are injected into luminescent layer 4 from anode 2 via hole-transporting layer 3, and electrons are injected into luminescent layer 4 from cathode 5. Recombination of holes and electrons are generated in luminescent layer 4, and a luminescence phenomenon is caused when the exciton which is formed with the recombination transfers from an excitation state to a ground state. When Alq is used in the above constitution, green luminescence can be obtained. It is also possible theoretically to obtain arbitrary luminescent colors by modifying molecular structures of organic compounds. Accordingly, an organic electroluminescence element can cope with the realization of full colors and it is promising as a display element in the future, with the advantage of low voltage driving. Further, the organic compound layer in the above constitution comprises the laminate structure of a hole-transporting layer for transporting holes and a luminescent layer, but other constitutions can be selected by selecting constitutional materials, such as the constitution of a luminescent layer alone, the three-layer structure comprising a hole-transporting layer, a luminescent layer, and an electron-transporting layer, or the constitution of a mixed layer comprising a luminescent layer and a hole-transporting layer, or a luminescent layer and an electron-transporting layer.

Further, a method is available which comprises doping an organic compound having high fluorescent quantum yield in a part of a luminescent layer as a dopant, and taking out luminescence from the dopant (a host-guest system). In this case, it is necessary that the transfer of exciton attended on the luminescence of the host material by itself should be conducted smoothly for the smooth transfer of the exciton to the dopant. Accordingly, it is necessary that conditions should be selected to be satisfied such that overlapping of the luminescent spectrum of the host material and the excitation wavelength of the dopant is large and the dopant is liable to be subjected to oxidation reduction as compared with the host material. Moreover, there is a case in which luminescence is caused without energy transfer of the luminescent spectrum from the host material by the element constitution taking an energy barrier into consideration. In such a case, as a material to be used as the host material, characteristics of efficiently injecting and transporting holes or electrons to the dopant are selected. Therefore, luminescence can be taken out by mixing the dopant in a hole-transporting layer and an electron-transporting layer which do not have a luminescent region. Highly efficient element can be provided by the realization of full colors of from blue to red by virtue of the luminescence by the dopant and by taking out strong luminescence of the dopant. In general, materials to be used as a dopant show strong quenching due to concentration and do not show distinct fluorescence in a solid state but show strong luminescence in a diluted solution in many cases, therefore, the use amount is preferably in a concentration of several mol % or less. Accordingly, the thinner the thickness of the film, the less is required the film forming property of the material, which is also advantageous in that the material can be selected from among the broader range.

As described above, arbitrary luminescent colors can be obtained by modifying molecular structures of the organic luminescent material to be used in a luminescent layer of an organic electroluminescence element. Further, various high efficient luminescence elements by adopting function-separating type laminate structure using a hole-transporting layer or by a host-guest system have been proposed. However, all of these are lacking in practicably satisfactory brightness characteristics and durability as characteristics of an electroluminescence element. In view of the above-described problems, the present invention aims at providing an organic electroluminescence element having high luminescent efficacy and high stability.

SUMMARY OF THE INVENTION

The present inventors have eagerly investigated for solving the above problems. As a result, we found that the above object of the present invention could be attained by using a certain organic compound. The present invention has been done based on the knowledge.

That is, the present invention provides:

(1) An organic electroluminescence element comprising a substrate having provided thereon an anode for injecting holes, a cathode for injecting electrons, and at least one organic compound layer therebetween, wherein the organic compound layer contains at least one compound represented by formula (I), and at least one compound represented by formula (II), (III) or (IV):

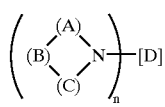
(I)

wherein (A), (B) and (C) each represents a substituted or unsubstituted o-arylene, vinylene or ethylene group; [D] represents a group derived from a compound containing at least one aromatic group; and n represents an integer of 1 or more;

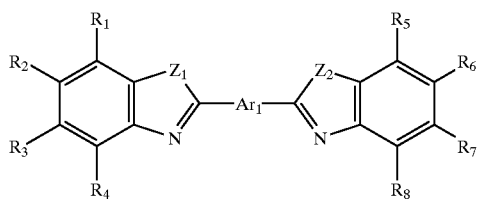
(II)

wherein $R_1$, $R_2$, $R_3$, $R_4$, $R_5$, $R_6$, $R_7$ and $R_8$ each represents a hydrogen atom or a substitutable group, and at least one of $R_1$ to $R_8$ represents an alkoxyl group, an aryloxy group, a dialkylamino group, an N-alkyl-N-arylamino group, or a diarylamino group; $Ar_1$ represents a divalent group derived from benzene, naphthalene, anthracene, or an aromatic heterocyclic ring, or from an aromatic hydrocarbon ring assembly; and $Z_1$ and $Z_2$ each represents an oxygen atom, a sulfur atom or a mono-substituted nitrogen atom;

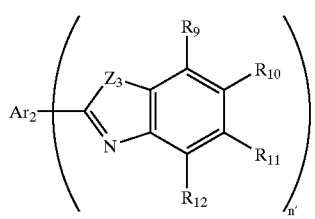
(III)

wherein $R_9$, $R_{10}$, $R_{11}$, and $R_{12}$ each represents a hydrogen atom or a substitutable group; $Ar_2$ represents a group derived from benzene, naphthalene, anthracene, or an aromatic heterocyclic ring, or from an aromatic ring assembly; $Z_3$ represents an oxygen atom, a sulfur atom or a mono-substituted nitrogen atom; and n' represents an integer of 3 or 4;

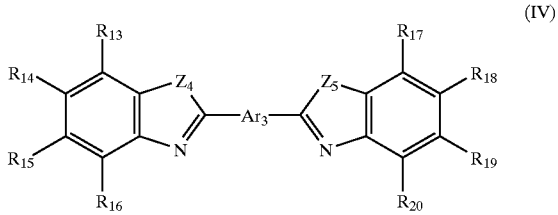
(IV)

wherein $R_{13}$, $R_{14}$, $R_{15}$, $R_{16}$, $R_{17}$, $R_{18}$, $R_{19}$ and $R_{20}$ each represents a hydrogen atom or a substitutable group; $Ar_3$ represents a divalent group derived from an aromatic ring assembly containing at least one aromatic heterocyclic ring; and $Z_4$ and $Z_5$ each represents an oxygen atom, a sulfur atom or a mono-substituted nitrogen atom.

(2) The organic electroluminescence element as described in the above item (1), wherein the organic compound layer comprises a luminescent layer having a luminescent region and the luminescent layer contains at least one compound represented by formula (II), (III) or (IV).

(3) The organic electroluminescence element as described in the above item (2), wherein the luminescent layer comprises at least two organic compounds and at least one of these two organic compounds contains at least one compound represented by formula (II), (III) or (IV).

(4) The organic electroluminescence element as described in the above item (1) or (2), wherein the organic compound layer comprises a hole-transporting layer which transports holes and the hole-transporting layer contains at least one compound represented by formula (I).

(5) The organic electroluminescence element as described in the above item (1) or (2), wherein the organic compound layer comprises an electron-transporting layer which transports electrons and the electron-transporting layer contains at least one compound represented by formula (II), (III) or (IV).

(6) The organic electroluminescence element as described in the above item (1), wherein the organic compound layer comprises a high polymer dispersion layer dispersed in a high polymer compound.

(7) The organic electroluminescence element as described in the above item (4), wherein the hole-transporting layer comprises a high polymer dispersion layer dispersed in a high polymer compound.

(8) An organic electroluminescence element comprising a substrate having provided thereon the anode for injecting holes, the cathode for injecting electrons, and at least one organic compound layer therebetween, wherein the organic compound layer contains at least one aromatic tertiary amine compound represented by formula (Ia), (Ib) or (Ic):

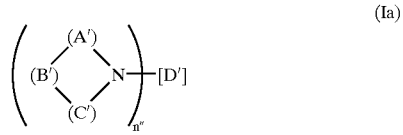
(Ia)

wherein (A'), (B') and (C') each represents a substituted or unsubstituted o-arylene, vinylene or ethylene group, and at least two of them represent a substituted or unsubstituted o-arylene group; [D'] represents a group derived from a compound containing at least one aromatic group; and n" represents an integer of 1 or more, provided that when (B') represents a vinylene or ethylene group, n" represents an integer of 2 or more;

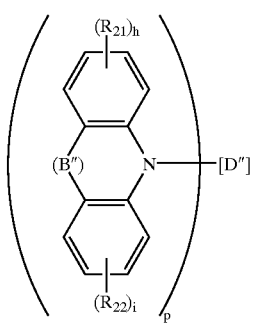

(Ib)

wherein (B") represents a substituted or unsubstituted o-arylene, vinylene or ethylene group; $R_{21}$ and $R_{22}$ each represents a substituent; h and i each represents an integer of from 0 to 4; [D"] represents a group derived from a compound containing at least one aromatic group; and p represents an integer of 1 or more, provided that when (B") represents a vinylene or ethylene group, p represents an integer of 2 or more;

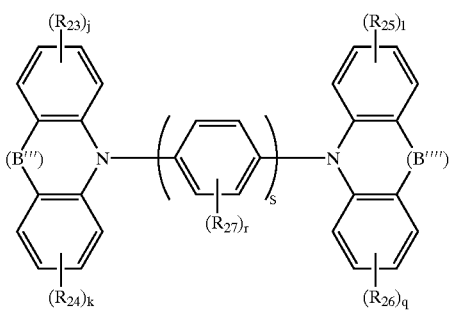

(Ic)

wherein (B''') and (B'''') each represents a substituted or unsubstituted o-arylene, vinylene or ethylene group; $R_{23}$, $R_{24}$, $R_{25}$, $R_{26}$ and $R_{27}$ each represents a substituent; j, k, l, q and r each represents an integer of from 0 to 4; and s represents an integer of 1 or more.

(9) The organic electroluminescence element as described in the above item (8), wherein the organic compound layer comprises a hole-transporting layer which transports holes and a luminescent layer having a luminescent region and the hole-transporting layer contains at least one aromatic tertiary amine compound represented by formula (Ia), (Ib) or (Ic).

(10) The organic electroluminescence element as described in the above item (8), wherein the organic compound layer comprises a high polymer dispersion layer dispersed in a high polymer compound.

(11) The organic electroluminescence element as described in the above item (9), wherein the hole-transporting layer comprises a high polymer dispersion layer dispersed in a high polymer compound.

Due to the above constitutions, the organic electroluminescence element according to the present invention can maintain luminescent function efficiently and stably for a long period of time.

BRIEF DESCRIPTION OF THE DRAWINGS

The FIGURE is a constitution drawing of an organic electroluminescence element.

DETAILED DESCRIPTION OF THE INVENTION

The compound represented by formula (I) is described in detail below.

(A), (B) and (C) in formula (I) each represents a substituted or unsubstituted o-arylene, vinylene or ethylene group. Specific examples of unsubstituted groups of these groups include the following groups:

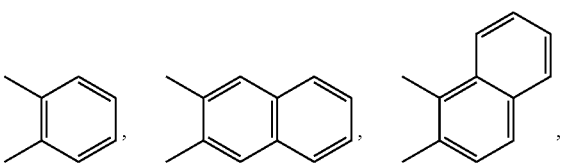

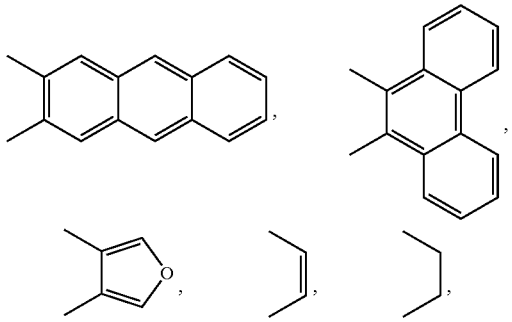

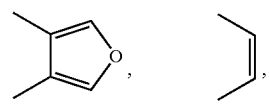

(A) and (C) each preferably represents a substituted or unsubstituted o-arylene group, and (B) preferably represents a substituted or unsubstituted o-arylene, vinylene or ethylene group. (A) and (C) each more preferably represents a substituted or unsubstituted o-phenylene group, and (B) more preferably represents a substituted or unsubstituted o-arylene or vinylene group. (A) and (C) each particularly preferably represents an unsubstituted o-phenylene group, and (B) particularly preferably represents a substituted or unsubstituted o-arylene group.

[D] in formula (I) represents a group derived from a compound containing at least one aromatic group. Specific examples of "a compound containing at least one aromatic group" include, e.g., substituted or unsubstituted benzene, condensed polycyclic hydrocarbon (naphthalene, anthracene, phenanthrene, fluoranthene, triphenylene, pyrene, chrysene, naphthacene, picene, perylene, pentaphene, pentacene, fluorene), an aromatic heterocyclic ring (thiophene, furan, pyrrole, pyrazole, pyridine, triazine), an aromatic hydrocarbon ring assembly (biphenyl, terphenyl, quaterphenyl, sexiphenyl, 2,2'-binaphthyl, 1,3,5-triphenylbenzene, 9,10-diphenylanthracene), an aromatic heterocyclic ring assembly (2,2'-bifuran, 2,2'-bithiophene, 2,2'-bipyrrole, 2,2'-bipyridyl, 2,2':5',2":5",2"'-quaterthienyl, 2,2':5',2":5",2"':5"',2""-sexithienyl), a mixed ring assembly of an aromatic hydrocarbon ring and an aromatic heterocyclic ring (2-phenylthiophene, 2,5-diphenylthiophene, 2,5-thienylbenzene, 4,4'-dithienylbiphenyl, 1,3,5-trithienylbenzene, 2,4,6-triphenyltriazine), aromatic group-substituted unsaturated hydrocarbon (1,2-diphenylethylene, 1,1,2-triphenylethylene, 1,1,2,2-tetraphenylethylene, diphenylacetylene), aromatic ether (diphenyl ether, 1,4-diphenoxybenzene, 1,3,5-triphenoxybenzene), and aromatic amine (triphenylamine, N,N-bis(4-biphenylyl)aniline, tris (4-biphenylyl)amine). [D] is a group derived from these compounds and an n-valent group. In addition, ring assemblies are defined as "those in which two or more ring systems are directly bonded by a single bond or a double bond, and the number of the bonds directly connecting the rings is fewer than the number of the ring systems by one" (Kenzo Hirayama, Kazuo Hirayama, *Organic Chemistry Biochemical Nomenclature*, Revised Second Edition, Upper Volume, page 39, Nankodo Publishing Co., Ltd. (1988).

[D] preferably represents a group derived from substituted or unsubstituted benzene, an aromatic hydrocarbon ring assembly, aromatic group-substituted unsaturated hydrocarbon, aromatic ether, or aromatic amine, and particularly preferably represents a divalent or trivalent group derived from a substituted or unsubstituted aromatic hydrocarbon ring assembly, aromatic group-substituted unsaturated hydrocarbon, or aromatic amine.

Examples of substituents which (A), (B), (C) and [D] may have include a halogen atom, substituted or unsubstituted alkyl, aryl, alkoxyl, aryloxy, dialkylamino, N-alkyl-N-arylamino and diarylamino groups, specifically, a halogen atom (e.g., fluorine, bromine, iodine), a substituted or unsubstituted, straight chain or branched alkyl group having from 1 to 20 carbon atoms, a substituted or unsubstituted aryl group having from 6 to 36 carbon atoms, a substituted or unsubstituted alkoxyl group having from 1 to 20 carbon atoms, a substituted or unsubstituted aryloxy group having from 6 to 36 carbon atoms, a substituted or unsubstituted dialkylamino group having from 2 to 20 carbon atoms, a substituted or unsubstituted N-alkyl-N-arylamino group having from 7 to 42 carbon atoms, and a substituted or unsubstituted diarylamino group having from 12 to 48 carbon atoms.

More specific examples of substituents which (A), (B), (C) and [D] may have, other than a halogen atom, include an alkyl group (e.g., methyl, ethyl, n-propyl, n-octyl, n-dodecyl, 2-methoxyethyl, 2-phenylmethyl, benzyl, isopropyl, isobutyl, s-butyl, t-butyl, t-amyl, t-octyl, cyclopentyl, cyclohexyl, cycloheptyl), an aryl group (e.g., phenyl, 2-, 3- or 4-methylphenyl, 4-t-butylphenyl, 4-methoxyphenyl, 4-dimethylaminophenyl, 1- or 2-naphthyl, anthryl, phenanthryl), an alkoxyl group (e.g., methoxy, ethoxy, n-propoxy, n-butoxy, n-hexyl, isopropoxy, isobutoxy, t-butoxy, cyclopentyloxy, cyclohexyloxy), an aryloxy group (e.g., phenoxy, 2-, 3- or 4-methylphenoxy, 4-t-butylphenoxy, 4-phenylphenoxy, 4-methoxyphenoxy, 2-cyclohexylphenoxy, 3-ethylphenoxy, 1- or 2-naphthoxy, anthryloxy, phenanthryloxy), a dialkylamino group (e.g., dimethylamino, diethylamino, dibutylamino, dioctylamino, N-methylbutylamino, bis(2-methoxyethyl)amino, bis(2-chloroethyl)amino), an N-alkylarylamino group (e.g., N-methylanilino, N-butylanilino, N-methyl-1-naphthylamino), and a diarylamino group (e.g., diphenylamino, N-(3-methylphenyl)-anilino, N-(4-methylphenyl)anilino, bis(4-methylphenyl)amino, N-naphthylanilino, dinaphthylamino).

When these groups have a substituent, examples of the substituents include a halogen atom, an alkyl group, an aryl group, a heterocyclic group, a cyano group, a hydroxyl group, a nitro group, a carboxyl group, a sulfo group, an amino group, an alkoxyl group, an aryloxy group, an acylamino group, an alkylamino group, an anilino group, a ureido group, a sulfamoylamino group, an alkylthio group, an arylthio group, an alkoxycarbonylamino group, a sulfonamido group, a carbamoyl group, a sulfamoyl group, a sulfonyl group, an alkoxycarbonyl group, a heterocyclic oxy group, an azo group, an acyloxy group, a carbamoyloxy group, a silyloxy group, an aryloxycarbonylamino group, an imido group, a heterocyclic thio group, a sulfinyl group, a phosphonyl group, an aryloxycarbonyl group, an acyl group, a silyl group and an azolyl group.

Preferred examples of substituents which (A), (B), (C) and [D] may have include a halogen atom, an alkyl group, an alkoxyl group, a dialkylamino group and a diarylamino group, and particularly preferably an alkyl group and a dialkylamino group.

In formula (I), n represents an integer of 1 or more. When n represents 2 or more, respective (A), (B) and (C) may be the same or different. When (B) represents an o-arylene group, n is preferably an integer of from 1 to 4, particularly preferably an integer of from 1 to 3. When (B) represents a vinylene or ethylene group, n is preferably an integer of 2 or more, particularly preferably an integer of 3 or more.

The compound represented by formula (I) is preferably represented by formula (Ia), (Ib) or (Ic):

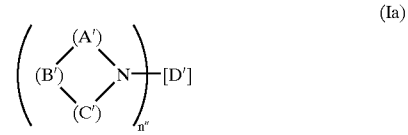

(Ia)

wherein (A'), (B') and (C') each represents a substituted or unsubstituted o-arylene, vinylene or ethylene group, and at least two of them represent a substituted or unsubstituted o-arylene group; [D'] represents a group derived from a compound containing at least one aromatic group; and n" represents an integer of 1 or more, provided that when (B') represents a vinylene or ethylene group, n" represents an integer of 2 or more;

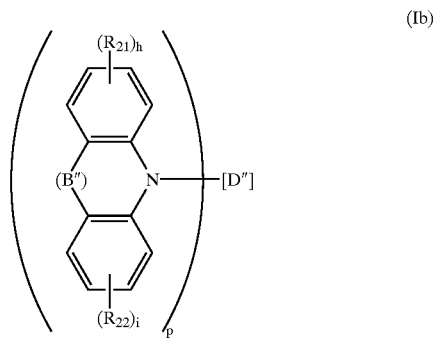

(Ib)

wherein (B") represents a substituted or unsubstituted o-arylene, vinylene or ethylene group; $R_{21}$ and $R_{22}$ each represents a substituent; h and i each represents an integer of from 0 to 4; [D"] represents a group derived from a compound containing at least one aromatic group; and p represents an integer of 1 or more, provided that when (B") represents a vinylene or ethylene group, p represents an integer of 2 or more;

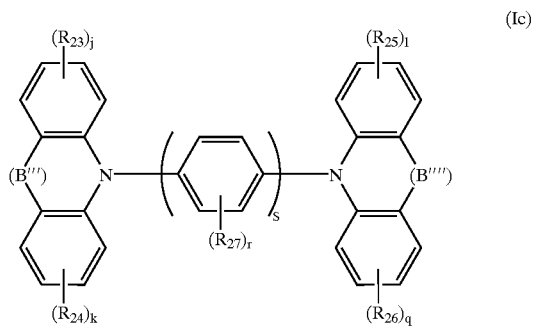

(Ic)

wherein (B'") and (B"") each represents a substituted or unsubstituted o-arylene, vinylene or ethylene group; $R_{23}$, $R_{24}$, $R_{25}$, $R_{26}$ and $R_{27}$ each represents a substituent; j, k, l, q and r each represents an integer of from 0 to 4; and s represents an integer of 1 or more.

(A'), (B') and (C') each represents a substituted or unsubstituted o-arylene, vinylene or ethylene group, and at least two of them represent a substituted or unsubstituted o-arylene group. Specifically, (A'), (B') and (C') each has the same meaning as defined in (A), (B) and (C). (B"), (B''') and (B"") each represents the same group as defined in (B'). [D'] and [D"] each represents a group derived from a compound containing at least one aromatic group, specifically [D'] and [D"] each represents the same group as defined in [D], and the valency of the group is n" or p. n" represents an integer of 1 or more, and when n" is 2 or more, respective (A'), (B') and (C') may be the same or different. When (B') represents a vinylene or ethylene group, n" represents an integer of 2 or more. n" preferably represents an integer of from 2 to 4, and particularly preferably 2. p represents an integer of 1 or more, and when p is 2 or more, respective (B"), $R_{21}$, $R_{22}$, h and i may be the same or different. When (B") represents a vinylene or ethylene group, p represents an integer of 2 or more. p preferably represents an integer of 2 or more, and particularly preferably 2. $R_{21}$ to $R_{27}$ each represents the same group as the substituents which (A), (B), (C) and [D] may have. h, i, j, k, l, q and r each represents an integer of from 0 to 4, preferably an integer of from 0 to 2, and more preferably 0 or 1. s represents an integer of 1 or more, and when s is 2 or more, $(R_{27})_r$ on each benzene ring may represent the same substituent or may be different.

The compound represented by formula (II) is described in detail below.

$R_1$ to $R_8$ in formula (II) each represents a hydrogen atom or a substitutable group. Specific examples of substitutable groups include a halogen atom, an alkyl group, an aryl group, a heterocyclic group, a cyano group, a hydroxyl group, a nitro group, a carboxyl group, a sulfo group, an amino group, an alkoxyl group, an aryloxy group, an acylamino group, an alkylamino group, an anilino group, a ureido group, a sulfamoylamino group, an alkylthio group, an arylthio group, an alkoxycarbonylamino group, a sulfonamido group, a carbamoyl group, a sulfamoyl group, a sulfonyl group, an alkoxycarbonyl group, a heterocyclic oxy group, an azo group, an acyloxy group, a carbamoyloxy group, a silyloxy group, an aryloxycarbonylamino group, an imido group, a heterocyclic thio group, a sulfinyl group, a phosphonyl group, an aryloxycarbonyl group, an acyl group, a silyl group and an azolyl group. Adjacent groups of $R_1$ to $R_8$ may be bonded to make a saturated or unsaturated ring.

$R_1$ to $R_8$ each preferably represents a hydrogen atom, a halogen atom, an alkyl group, an aryl group, an alkoxyl group, an aryloxy group, a dialkylamino group, an N-alkylarylamino group, or a diarylamino group, specifically, a hydrogen atom, a halogen atom (e.g., fluorine, chlorine, bromine), a substituted or unsubstituted, straight chain or branched alkyl group having from 1 to 12 carbon atoms, a substituted or unsubstituted aryl group having from 6 to 20 carbon atoms, a substituted or unsubstituted alkoxyl group having from 1 to 6 carbon atoms, a substituted or unsubstituted aryloxy group having from 6 to 20 carbon atoms, a substituted or unsubstituted dialkylamino group having from 2 to 16 carbon atoms, a substituted or unsubstituted N-alkylarylamino group having from 7 to 21 carbon atoms, or a substituted or unsubstituted diarylamino group having from 12 to 36 carbon atoms.

More specific examples other than a hydrogen atom and a halogen atom include an alkyl group (e.g., methyl, ethyl, n-propyl, n-octyl, n-dodecyl, 2-methoxyethyl, 2-phenylmethyl, benzyl, isopropyl, isobutyl, s-butyl, t-butyl, t-amyl, t-octyl, cyclopentyl, cyclohexyl, cycloheptyl), an aryl group (e.g., phenyl, 2-, 3- or 4-methylphenyl, 4-t-butylphenyl, 4-methoxy-phenyl, 4-dimethylaminophenyl, 1- or 2-naphthyl, anthryl, phenanthryl), an alkoxyl group (e.g., methoxy, ethoxy, n-propoxy, n-butoxy, n-hexyl, isopropoxy, isobutoxy, t-butoxy, cyclopentyloxy, cyclohexyloxy), an aryloxy group (e.g., phenoxy, 2-, 3- or 4-methylphenoxy, 4-t-butylphenoxy, 4-phenylphenoxy, 4-methoxyphenoxy, 2-cyclohexylphenoxy, 3-ethylphenoxy, 1- or 2-naphthoxy, anthryloxy, phenanthryloxy), a dialkylamino group (e.g., dimethylamino, diethylamino, dibutylamino, dioctylamino, N-methylbutylamino, bis(2-methoxyethyl)amino, bis(2-chloroethyl)amino), an N-alkylarylamino group (e.g., N-methylanilino, N-butylanilino, N-methyl-1-naphthylamino), and a diarylamino group (e.g., diphenylamino, N-(3-methylphenyl)anilino, N-(4-methylphenyl)anilino, bis(4-methylphenyl)amino, N-naphthylanilino, dinaphthylamino).

At least one of $R_1$ to $R_8$ represents an alkoxyl group, an aryloxy group, a dialkylamino group, an N-alkylarylamino group, or a diarylamino group, preferably at least one of $R_2$, $R_3$, $R_6$ and $R_7$ represents any of the above groups.

$Ar_1$ represents a divalent group derived from benzene, naphthalene, anthracene, or an aromatic heterocyclic ring, or from an aromatic hydrocarbon ring assembly. They may have a substituent. Specifically, the aromatic heterocyclic ring represents thiophene, furan, oxazole, oxadiazole, triazole, pyridine, pyrazine, pyrimidine, triazine or carbazole, and the aromatic hydrocarbon ring assembly represents a ring assembly comprising aromatic hydrocarbon ring series such as benzene, naphthalene, or anthracene. A preferred aromatic heterocyclic ring is thiophene and a preferred aromatic hydrocarbon ring assembly is a benzene ring assembly.

Representative examples of unsubstituted $Ar_1$ are shown below but examples should not be construed as being limited thereto, wherein R' represents an alkyl or aryl group.

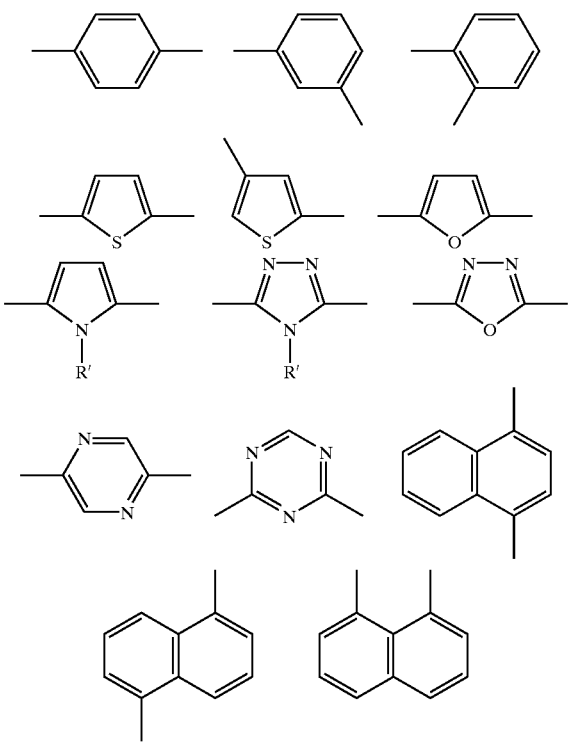

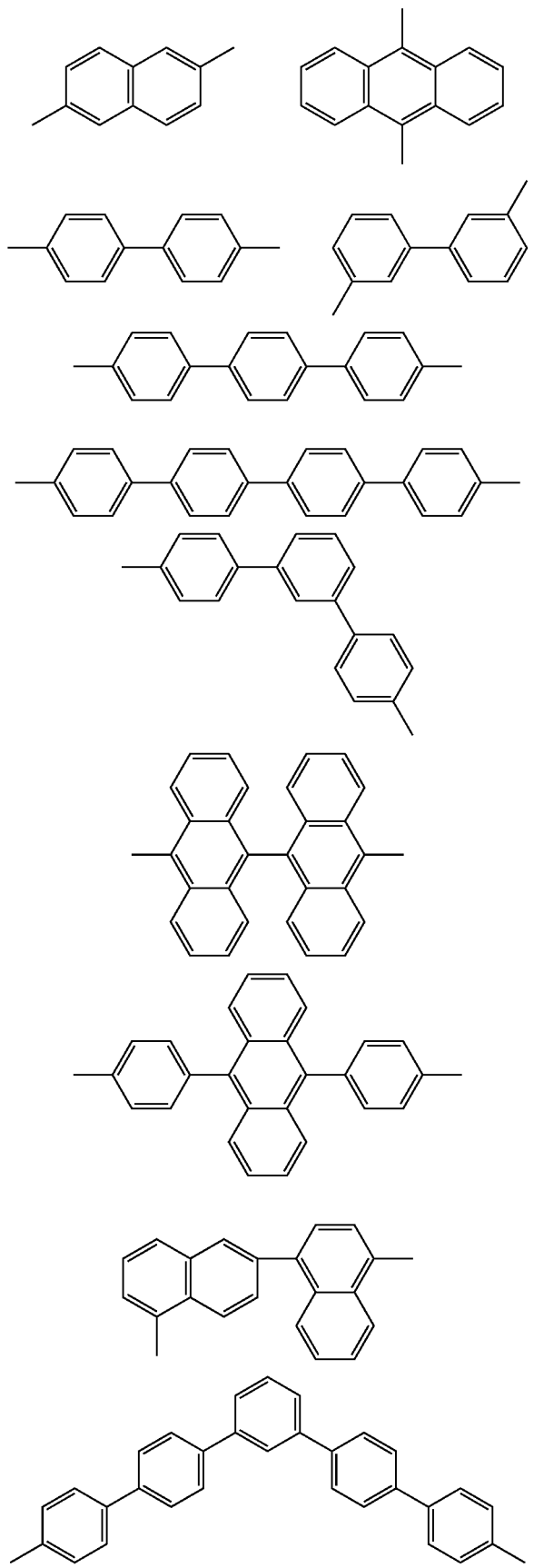

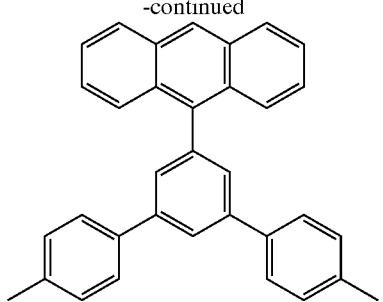

When Ar₁ is substituted, substituents which Ar₁ may have are the same as defined in R₁ to R₈, and examples of preferred substituents include a halogen atom, an alkyl group, an alkoxyl group, an aryloxy group, a dialkylamino group, an N-alkyl-arylamino group, and a diarylamino group. Ar₁ preferably represents a divalent group derived from an m- or o-phenylene group, 1,5-, 2,6- or 1,8-anthracenediyl group, or thiophene, or a divalent group derived from a benzene ring assembly, each of which is unsubstituted or has any of the above-described preferred substituents, and Ar₁ particularly preferably represents a divalent group derived from unsubstituted thiophene or a benzene ring assembly.

Z₁ and Z₂ each represents an oxygen atom, a sulfur atom or a mono-substituted nitrogen atom. Specifically, the mono-substituted nitrogen atom is a nitrogen atom substituted with an alkyl group or an aryl group, and the alkyl group and the aryl group are the same with the groups as defined in R₁ to R₈. Z₁ and Z₂ each preferably represents an oxygen atom or a sulfur atom and particularly preferably an oxygen atom.

The compound represented by formula (II) is preferably resented by formula (V) or (VI):

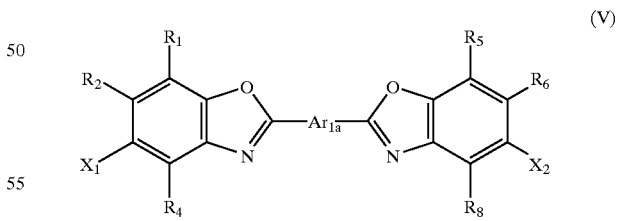

(V)

wherein R₁, R₂, R₄, R₅, R₆ and R₈ each represents the same group as defined above; X₁ and X₂ each represents an alkoxyl group, an aryloxy group, a dialkylamino group, an N-alkylarylamino group, or a diarylamino group; and Ar₁ₐ represents a divalent group derived from thiophene or from a benzene ring assembly;

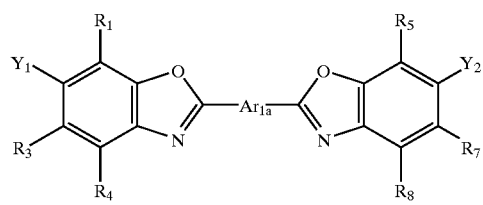

(VI)

wherein $R_1$, $R_3$, $R_4$, $R_5$, $R_7$ and $R_8$ each represents the same group as defined above; $Y_1$ and $Y_2$ each represents an alkoxyl group, an aryloxy group, a dialkylamino group, an N-alkylarylamino group, or a diarylamino group; and $Ar_{1a}$ represents the same group as defined above.

$X_1$, $X_2$, $Y_1$ and $Y_2$ each represents an alkoxyl group, an aryloxy group, a dialkylamino group, an N-alkylarylamino group, or a diarylamino group, and detailed explanation thereof is the same with that defined in $R_1$ to $R_8$. $Ar_{1a}$ represents a divalent group derived from thiophene or from a benzene ring assembly, and has the same meaning as defined above.

$X_1$, $X_2$, $Y_1$ and $Y_2$ each preferably represents an alkoxyl group, a dialkylamino group, or a diarylamino group. $Ar_{1a}$ preferably represents a divalent group derived from a benzene ring assembly.

The compound represented by formula (III) is described in detail below.

$R_9$, $R_{10}$, $R_{11}$ and $R_{12}$ in formula (III) each represents a hydrogen atom or a substitutable group. Specific examples of substitutable groups are the same as defined in $R_1$ to $R_8$, and preferred groups are also the same.

Particularly preferably, at least one of $R_9$ to $R_{12}$ represents a cycloalkyl group, an alkoxyl group, a dialkylamino group, an N-alkyl-N-arylamino group, or a diarylamino group.

$Ar_2$ represents a group derived from benzene, naphthalene, anthracene or an aromatic heterocyclic ring, or from an aromatic ring assembly. Describing in detail on the aromatic heterocyclic ring and the aromatic ring assembly of these, the aromatic heterocyclic ring represents thiophene, furan, pyrrole, oxazole, pyridine, pyrazine, pyrimidine, or carbazole, and the aromatic ring assembly represents a ring assembly comprising aromatic ring series (e.g., a hydrocarbon ring such as benzene, naphthalene or anthracene, and a heterocyclic ring such as thiophene, furan or pyrimidine). A preferred aromatic heterocyclic ring is thiophene and a preferred aromatic ring assembly is an aromatic hydrocarbon ring assembly or a mixed ring assembly of aromatic hydrocarbon and thiophene.

Representative examples of unsubstituted $Ar_2$ are shown below but examples should not be construed as being limited thereto.

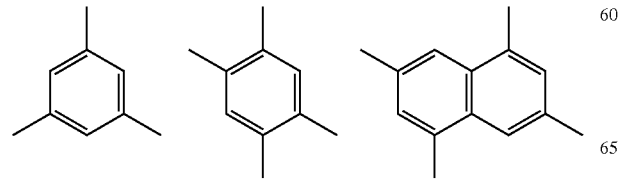

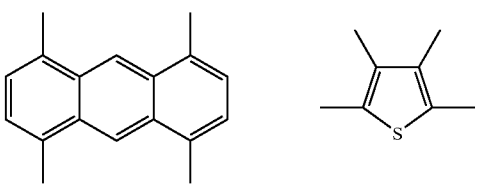

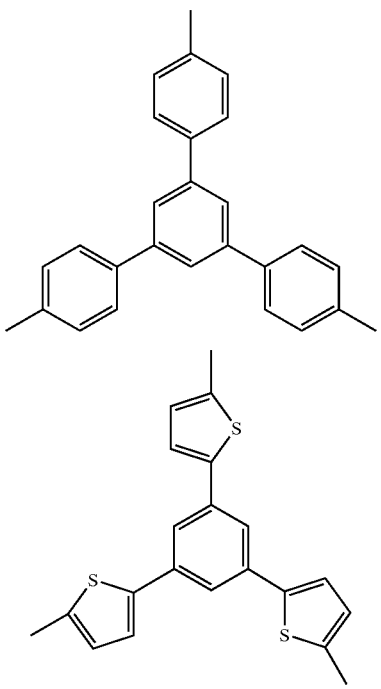

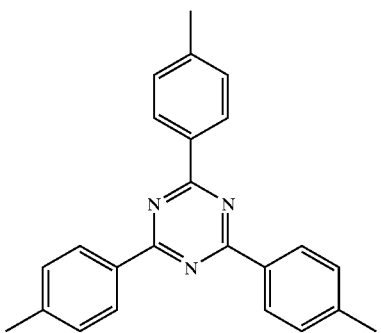

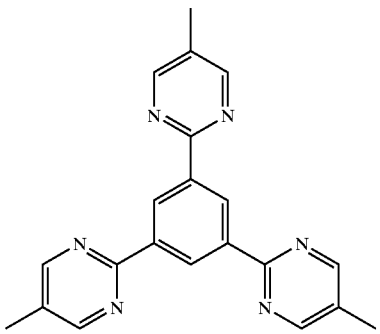

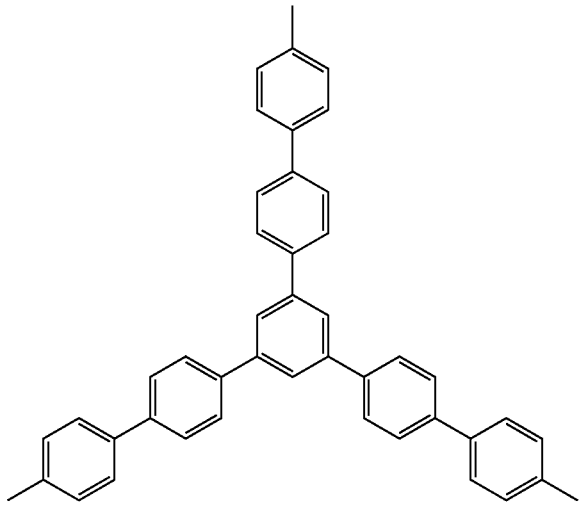

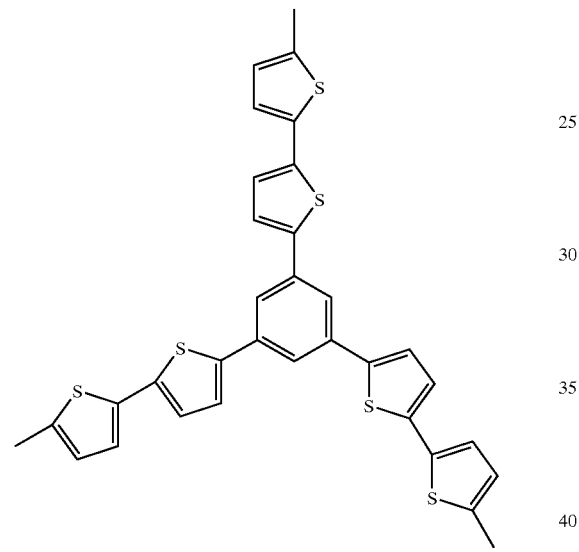

When Ar₂ is substituted, substituents which Ar₂ may have are the same with the substitutable groups as defined in R₉ to R₁₂, and examples of preferred substituents include a halogen atom, an alkyl group, an alkoxyl group, an aryloxy group, a dialkylamino group, an N-alkylarylamino group, and a diarylamino group. Ar₂ preferably represents a group derived from benzene, naphthalene, anthracene or an aromatic heterocyclic ring, or from an aromatic ring assembly, each of which is unsubstituted or has any of the above-described substituents, and particularly preferably represents a group derived from unsubstituted benzene, thiophene, aromatic hydrocarbon ring assembly or a mixed ring assembly of aromatic hydrocarbon and thiophene.

Z₃ represents the same atom as defined in Z₁ and Z₂.

n' represents an integer of 3 or 4, preferably 3. The compound represented by formula (III) has three or four benzoxazoles or benzothiazoles in the molecule, all of which may be the same or different.

The compound represented by formula (IV) is described in detail below.

R₁₃ to R₂₀ in formula (IV) each represents a hydrogen atom or a substitutable group. Specific examples of substitutable groups are the same as defined in R₁ to R₈, and preferred groups are also the same.

Ar₃ represents a divalent group derived from an aromatic ring assembly containing at least one aromatic heterocyclic ring. Specifically describing, Ar₃ represents a divalent group derived from an aromatic ring assembly comprising at least one aromatic heterocyclic ring, such as thiophene, furan, oxazole, oxadiazole, triazole, pyridine, pyrazine, pyrimidine, triazine or carbazole, and an aromatic ring other than an aromatic heterocyclic ring, such as an aromatic hydrocarbon ring, e.g., benzene, naphthalene, anthracene.

When Ar₃ has substituents, the substituents are the same with the substitutable groups as defined in R₁ to R₈, and examples of preferred substituents include a halogen atom, an alkyl group, an alkoxyl group, an aryloxy group, a dialkylamino group, an N-alkylarylamino group, and a diarylamino group. Ar₃ preferably represents a divalent group derived from an aromatic ring assembly containing at least one thiophene ring, and unsubstituted or having the above-described preferred substituents. Ar₃ particularly preferably represents a divalent group derived from an unsubstituted aromatic ring assembly comprising only thiophene rings, or comprising a thiophene ring and a benzene ring.

Representative specific examples of unsubstituted Ar₃ are shown below but examples should not be construed as being limited thereto.

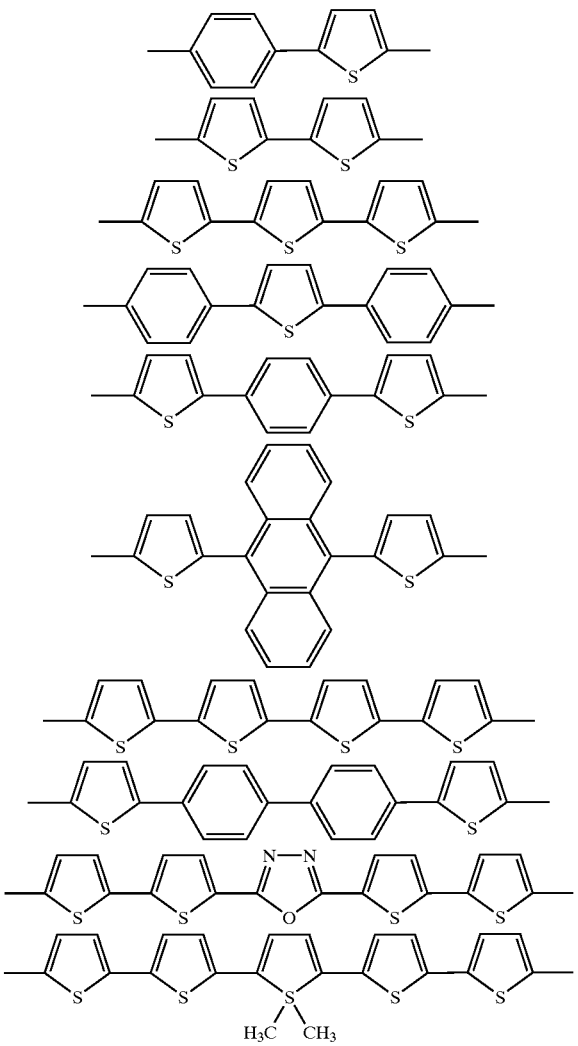

-continued

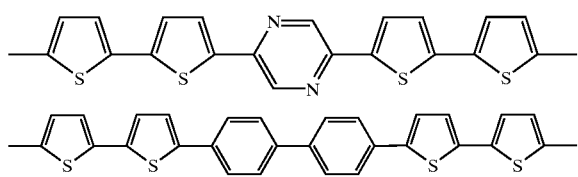

$Z_4$ and $Z_5$ each represents the same atom as defined in $Z_1$ and $Z_2$.

The compound represented by formula (IV) is preferably represented by formula (VII):

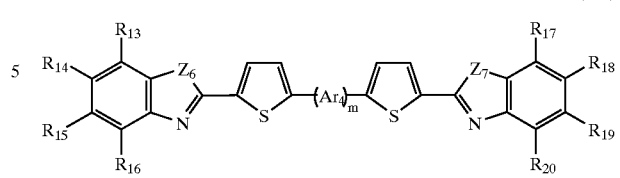

(VII)

wherein $R_{13}$, $R_{14}$, $R_{15}$, $R_{16}$, $R_{17}$, $R_{18}$, $R_{19}$ and $R_{20}$ have the same meaning as defined above; $Ar_4$ represents a 2,5-thiophenediyl group or a p-phenylene group; $Z_6$ and $Z_7$ each represents an oxygen atom or a sulfur atom; and m represents an integer of from 0 to 5.

Specific examples of the compounds represented by formulae (I) to (VII) according to the present invention are shown below, but the present invention is not limited thereto.

(1-1)

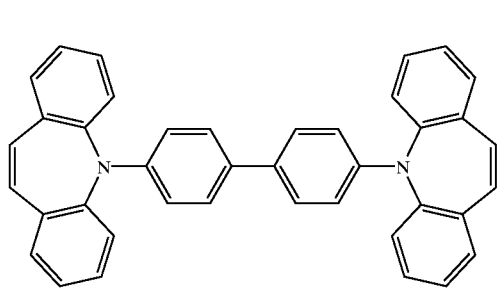

(1-2)

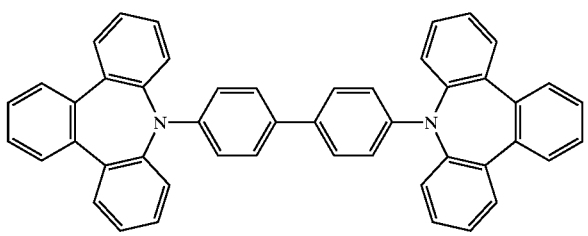

(1-3)

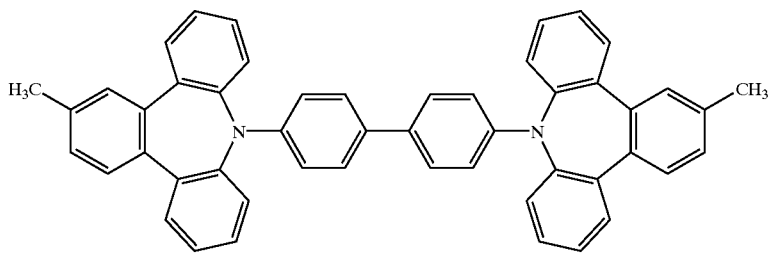

(1-4)

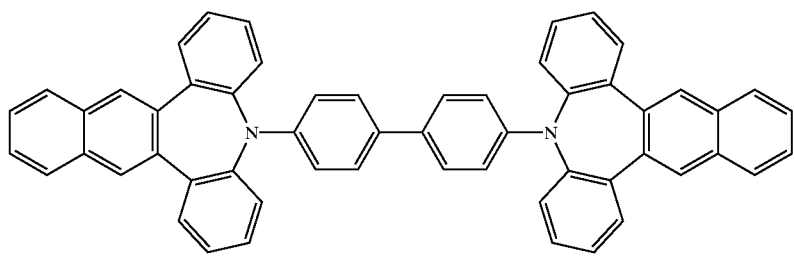

(1-5)

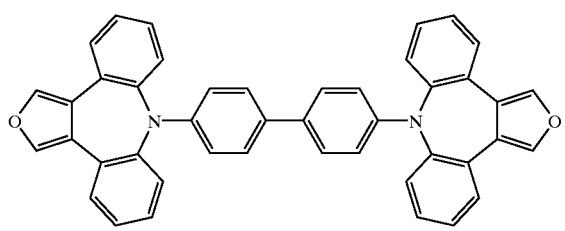

(1-6)

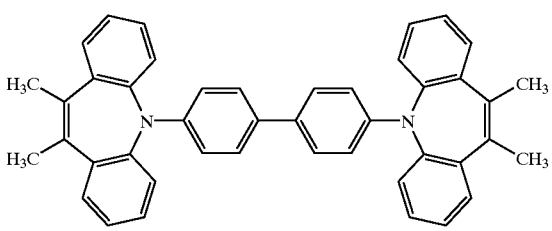

(1-7)
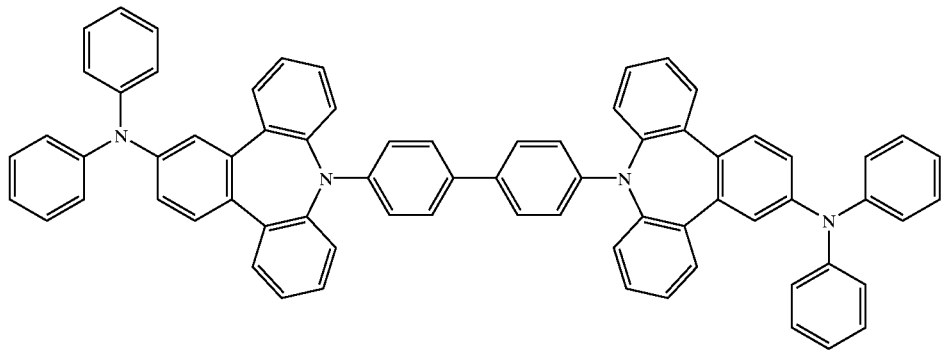
(1-8)
(1-9)
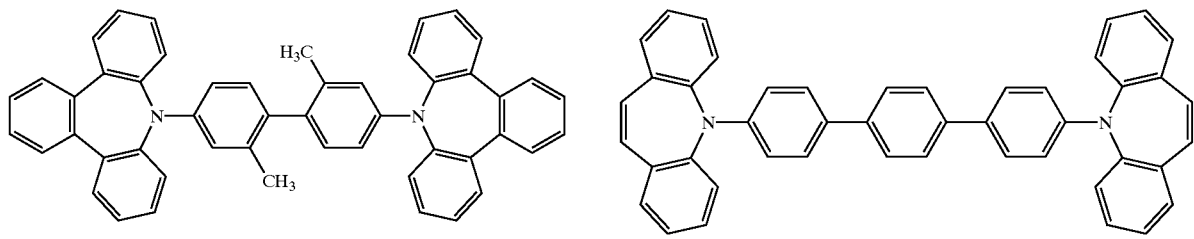
(1-10)
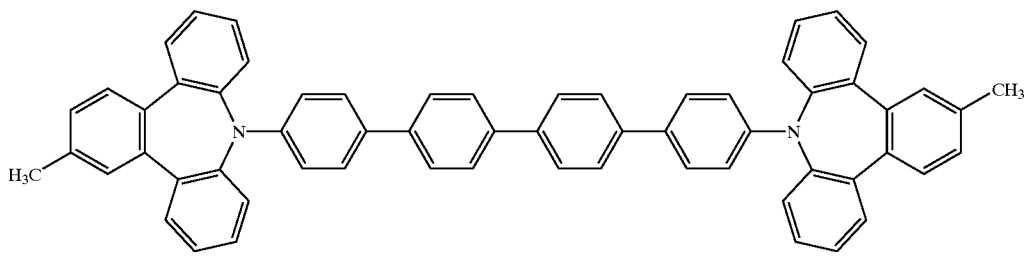
(1-11)
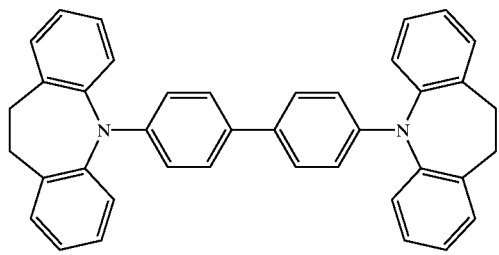

-continued
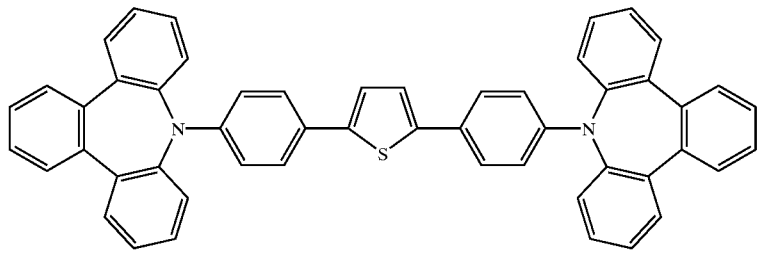
(1-12)
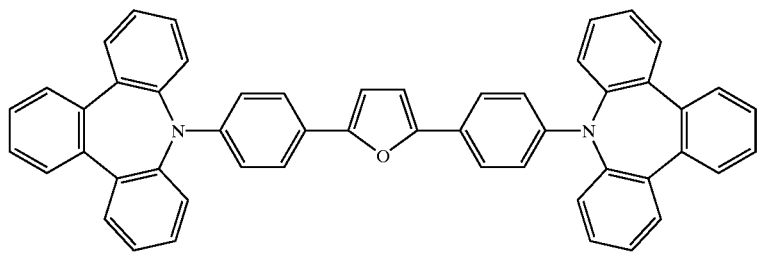
(1-13)
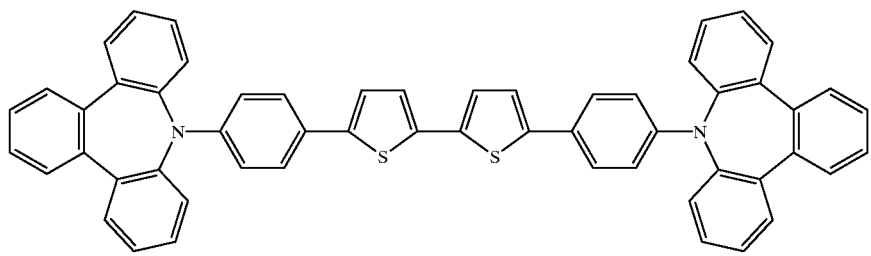
(1-14)
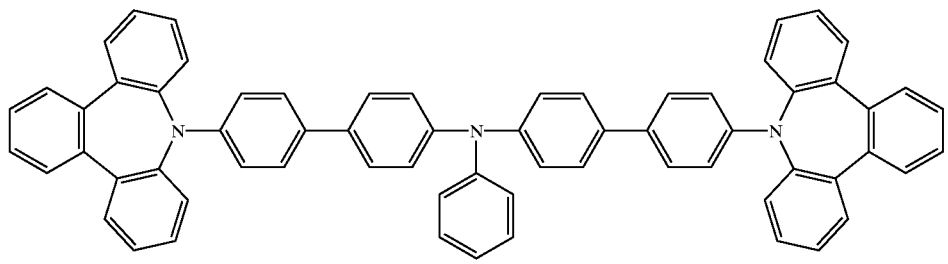
(1-15)
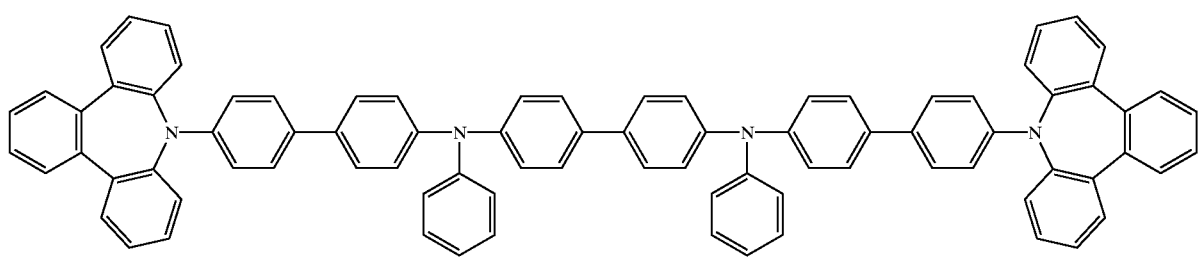
(1-16)

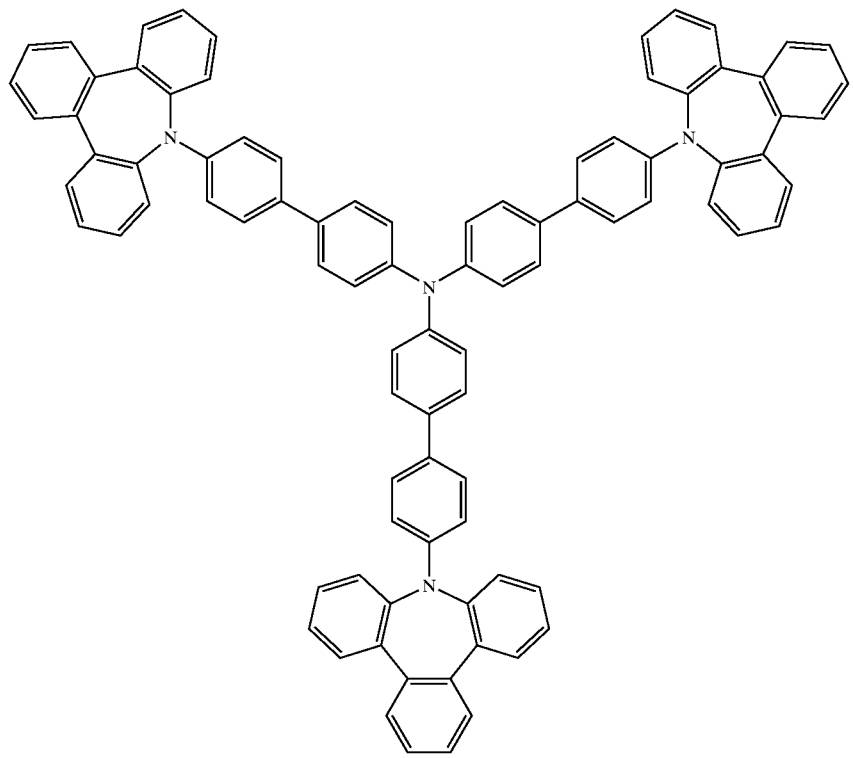
(1-17)
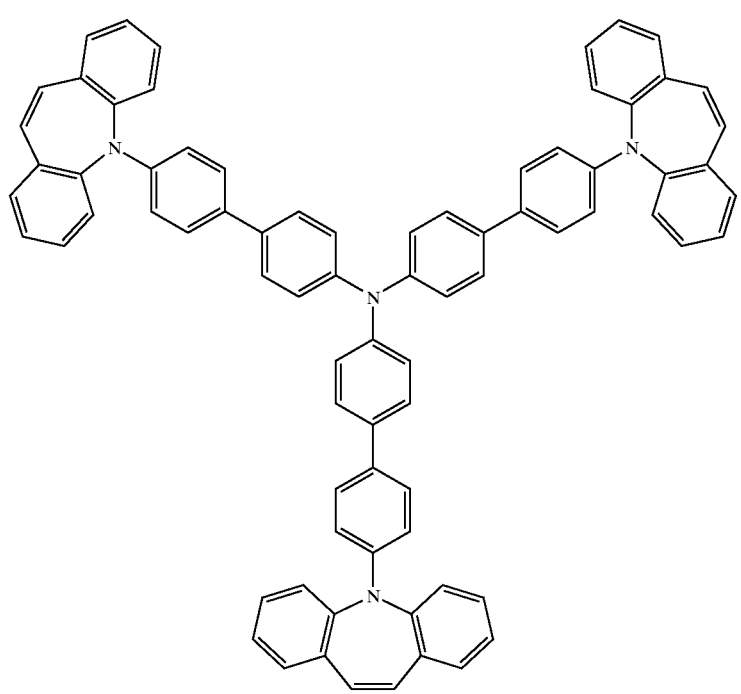
(1-18)

(1-19)
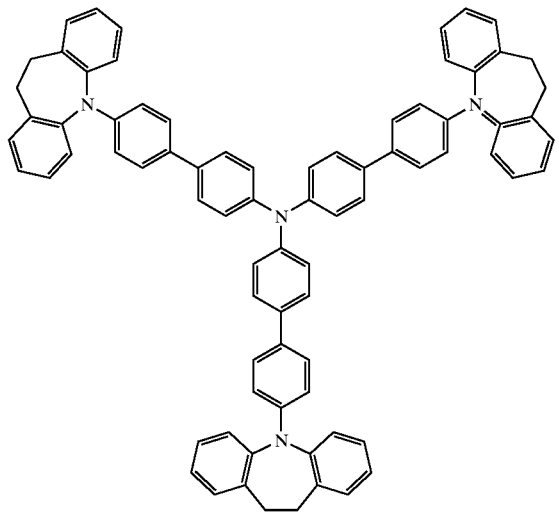
(1-20)
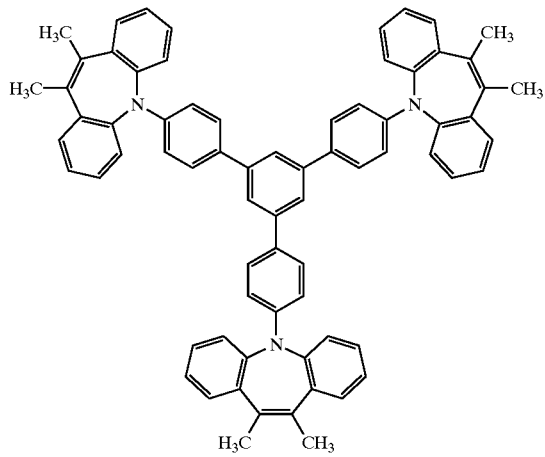
(1-20)
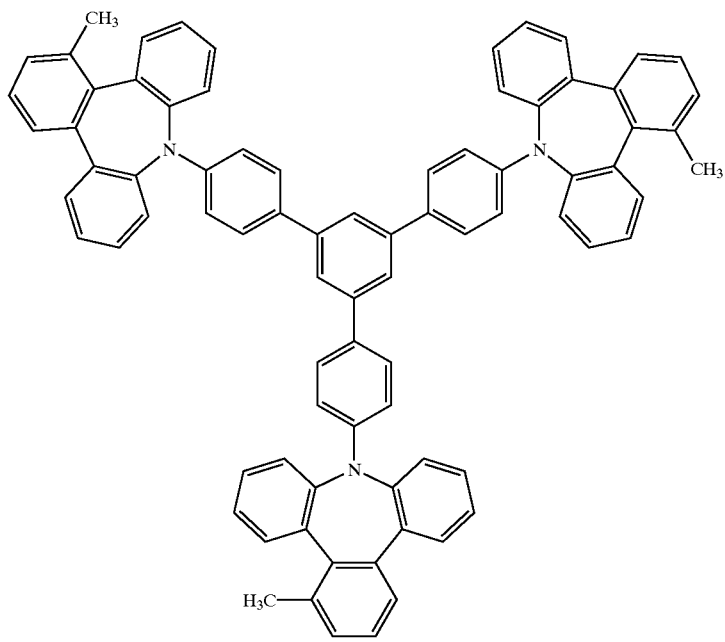

(1-22)
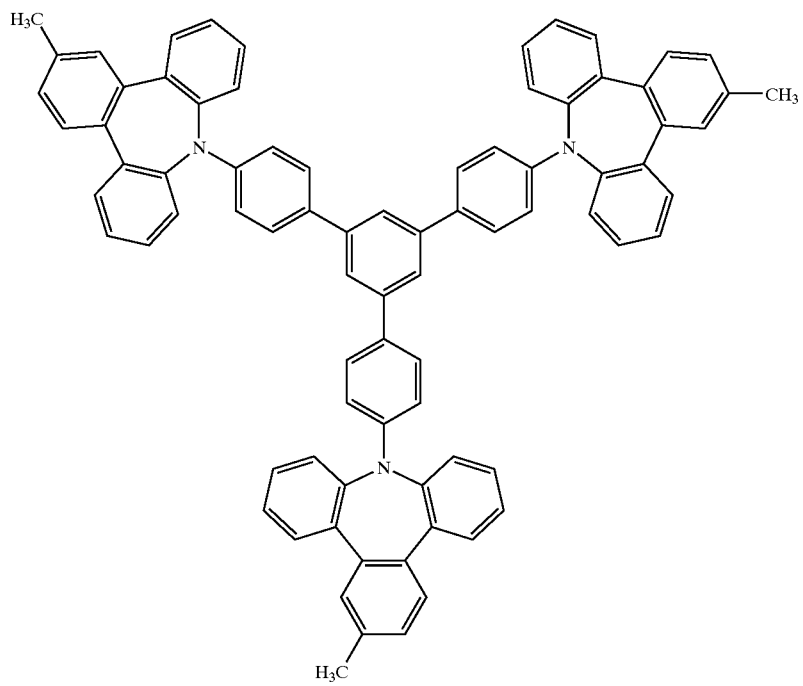
(1-23)
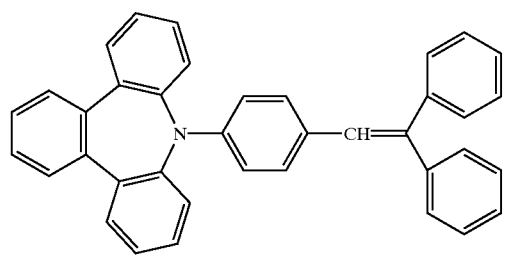
(1-24)
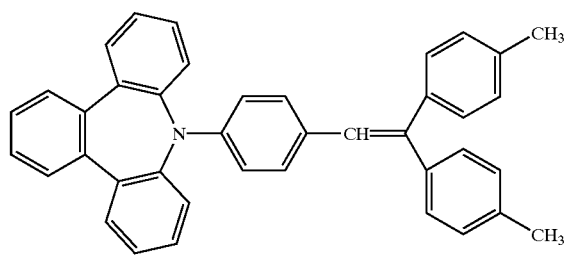
(1-25)
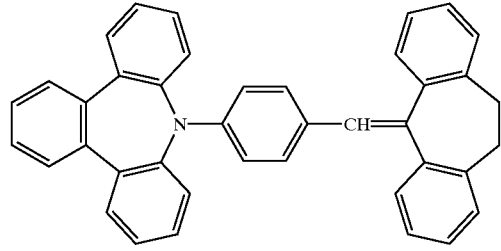
(1-26)
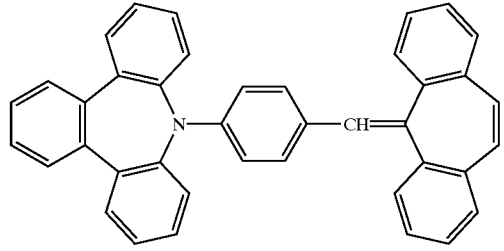
(1-27)
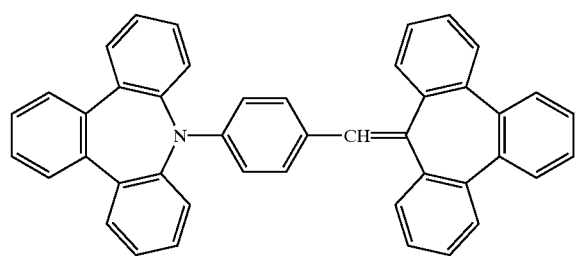
(1-28)
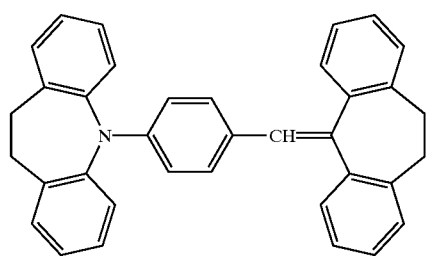

-continued
(1-29)
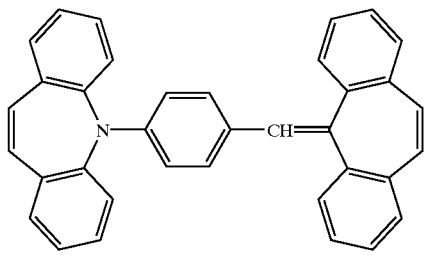
(1-30)
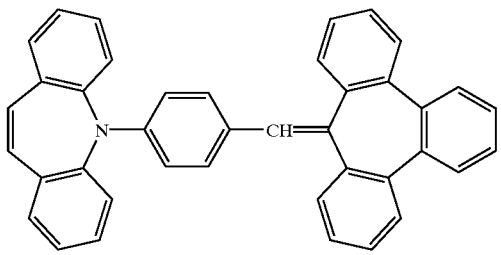
(1-31)
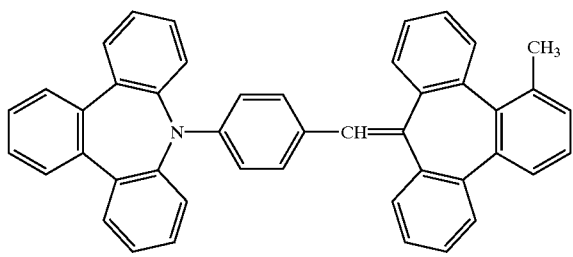
(1-32)
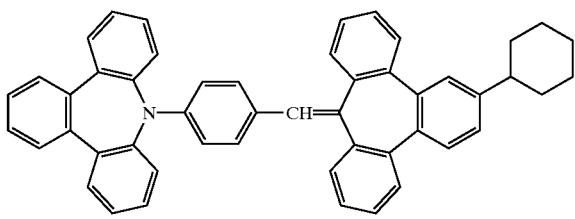
(1-33)
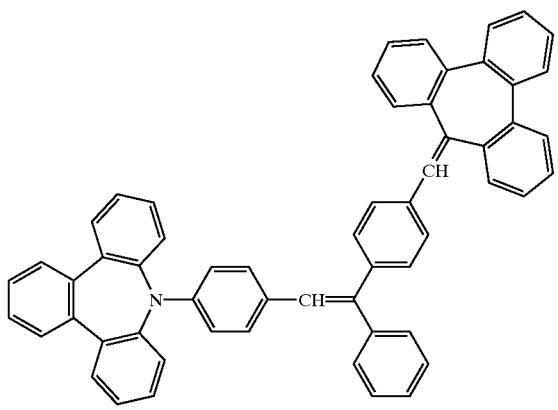
(1-34)
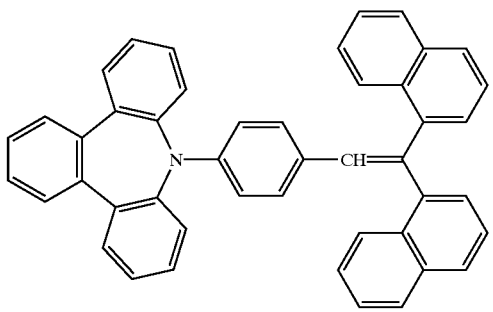
(1-35)
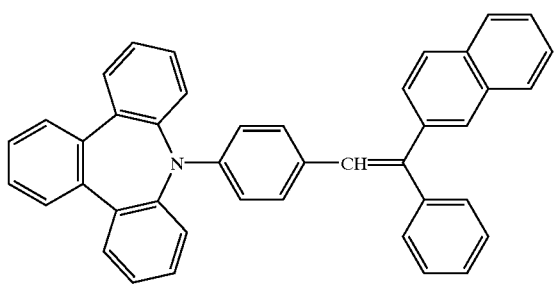
(1-36)
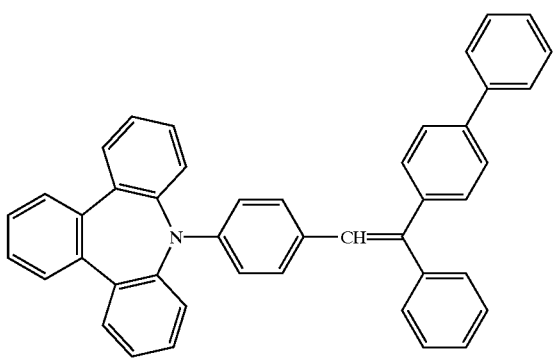

-continued
(1-37)
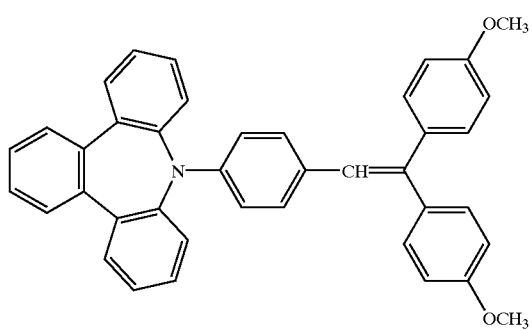
(1-38)
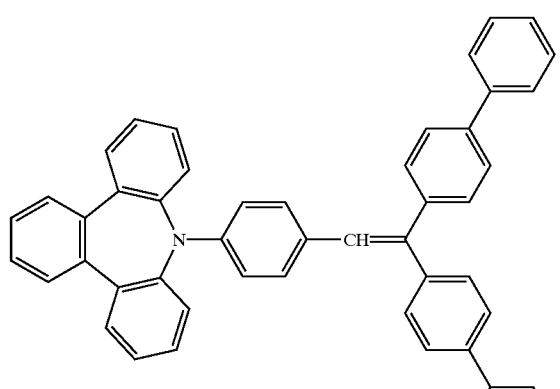
(1-39)
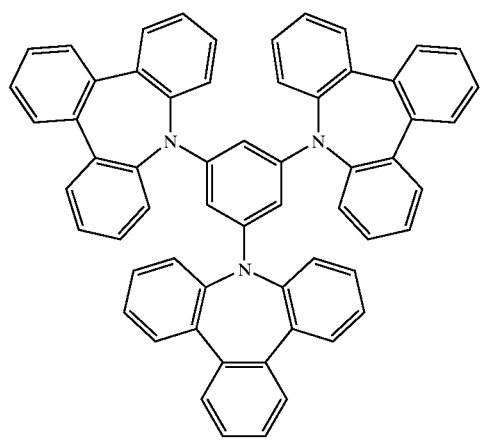
(1-40)
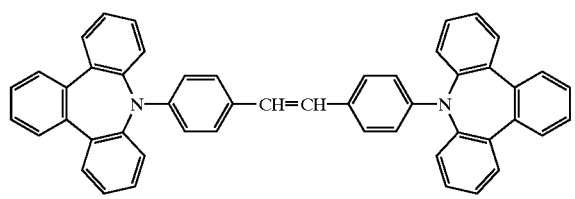
(2-1)
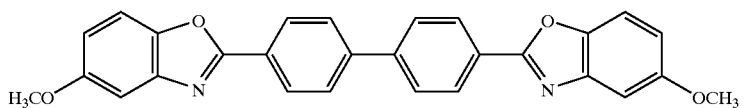
(2-2)
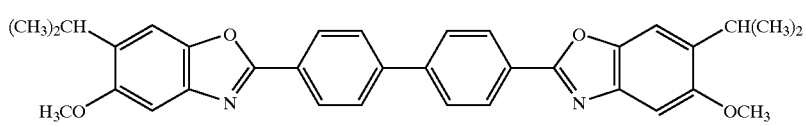
(2-3)
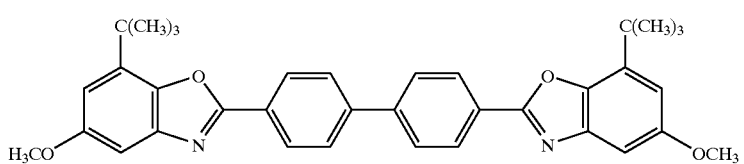
(2-4)
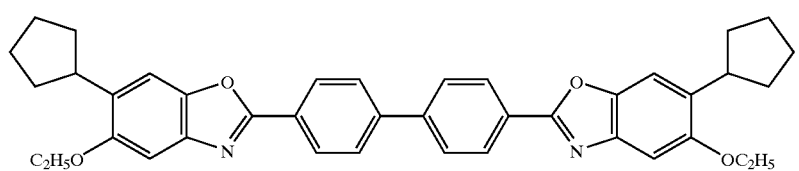
(2-5)
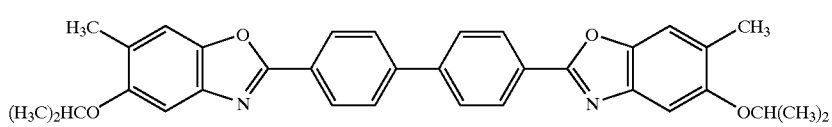

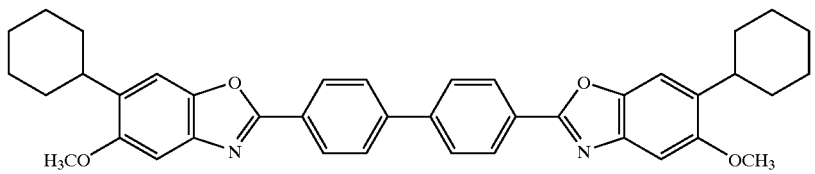
(2-6)
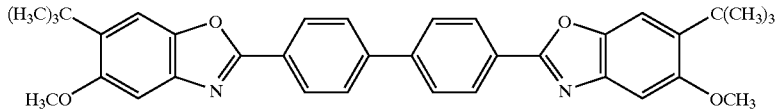
(2-7)
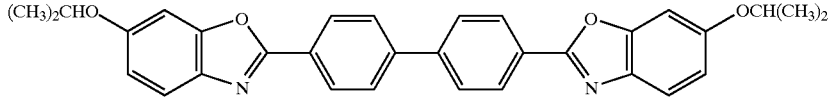
(2-8)
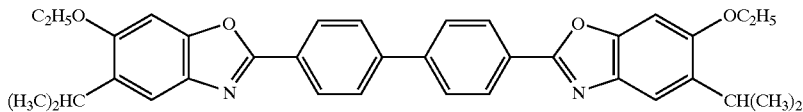
(2-9)
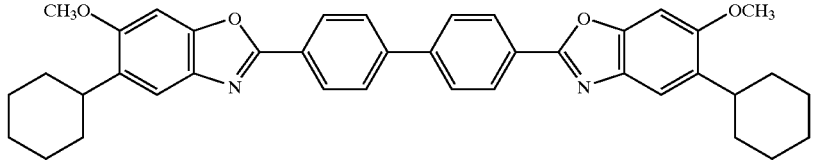
(2-10)
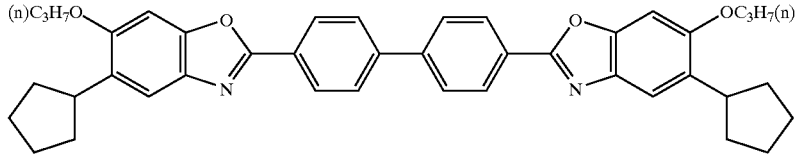
(2-11)
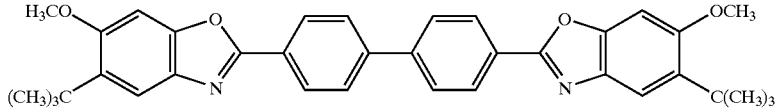
(2-12)
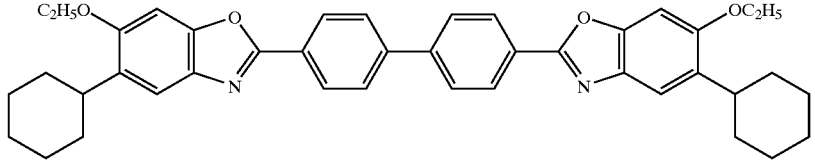
(2-13)
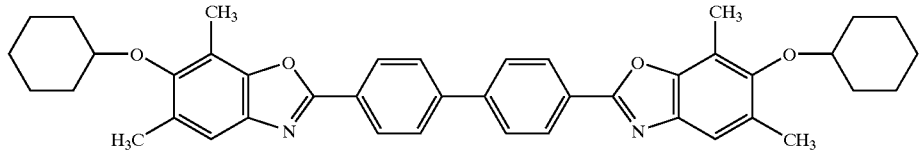
(2-14)
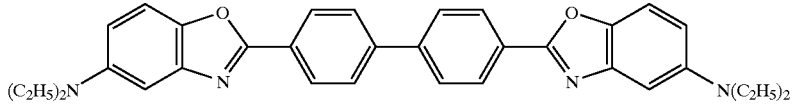
(2-15)
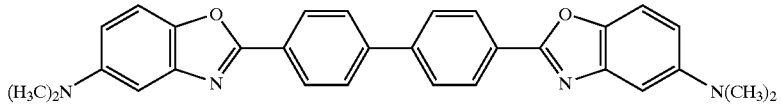
(2-16)

-continued
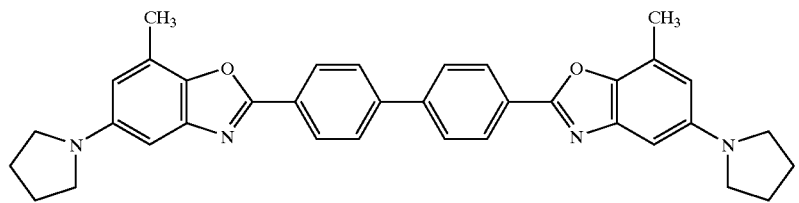
(2-17)
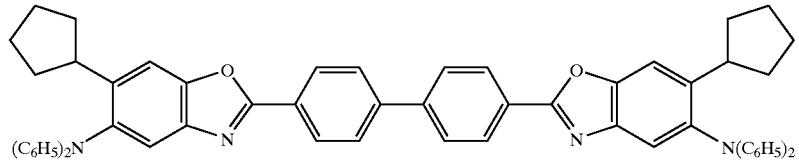
(2-18)
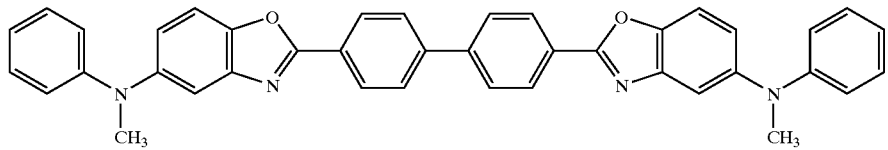
(2-19)
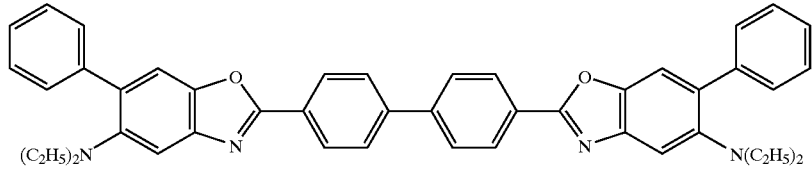
(2-20)
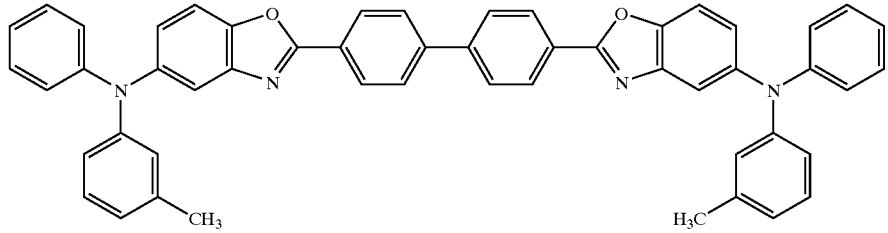
(2-21)
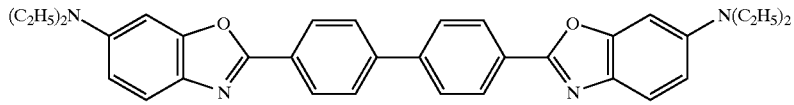
(2-22)
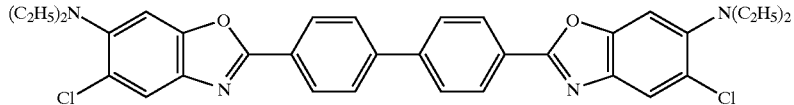
(2-23)
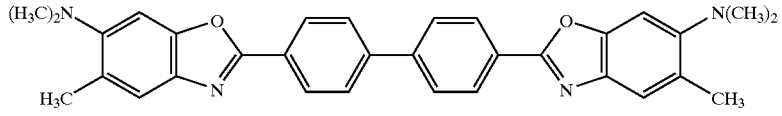
(2-24)
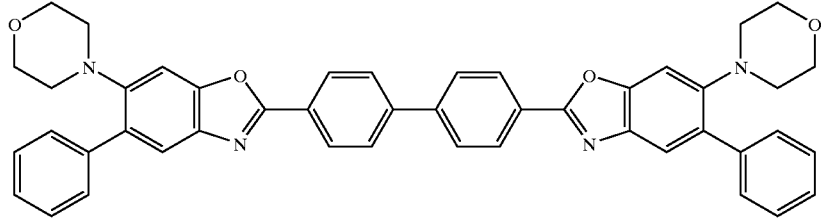
(2-25)

-continued
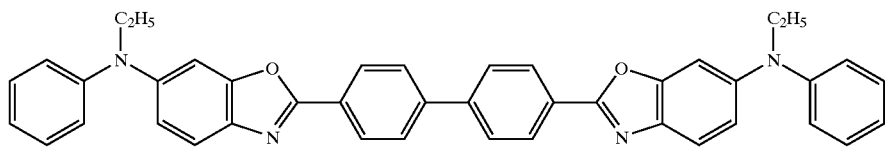
(2-26)
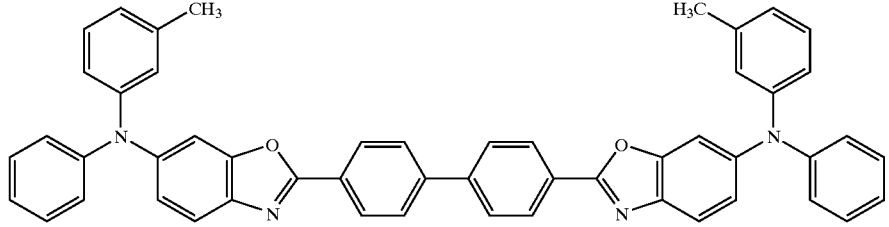
(2-27)
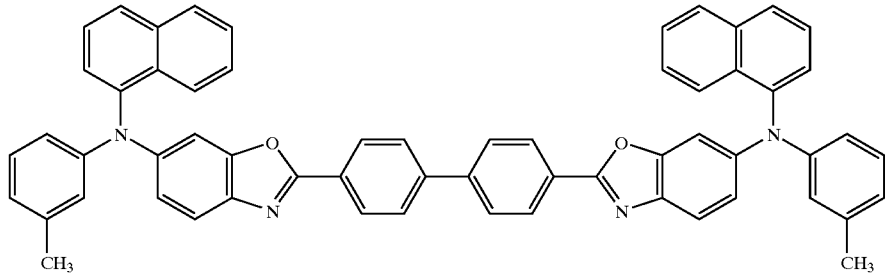
(2-28)
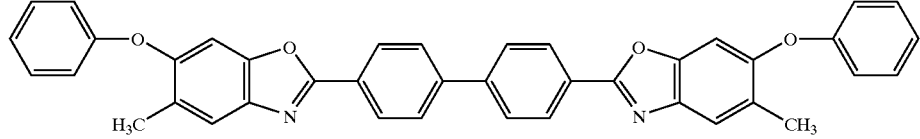
(2-29)
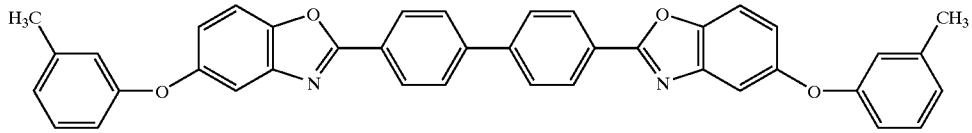
(2-30)
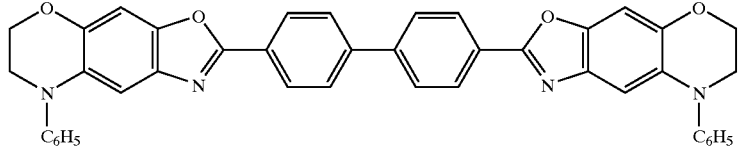
(2-31)
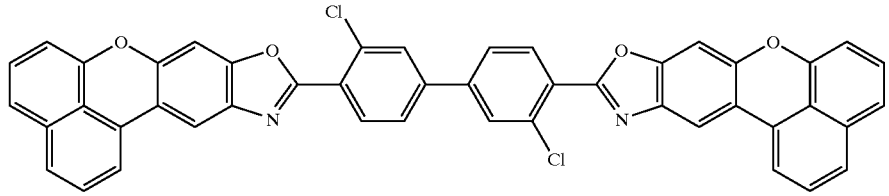
(2-32)
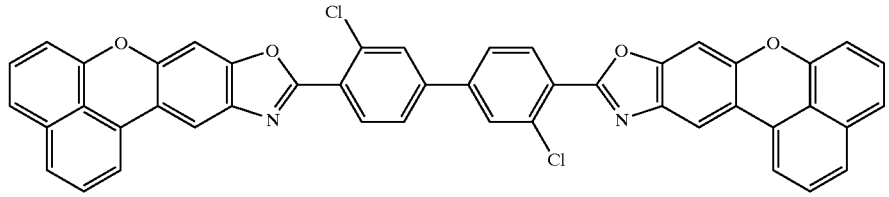
(2-32)

-continued
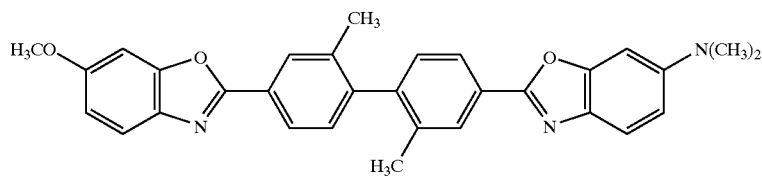
(2-33)
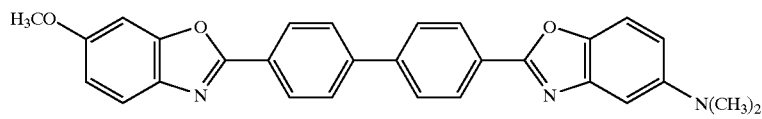
(2-34)
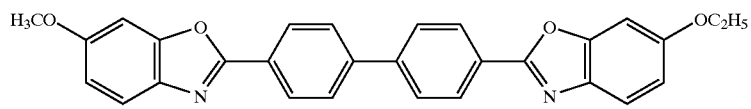
(2-35)
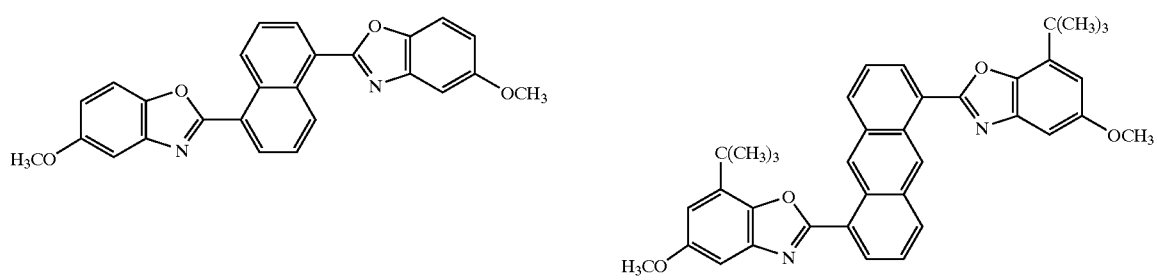
(2-36) (2-37)
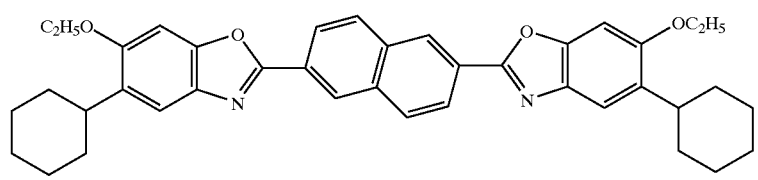
(2-38)
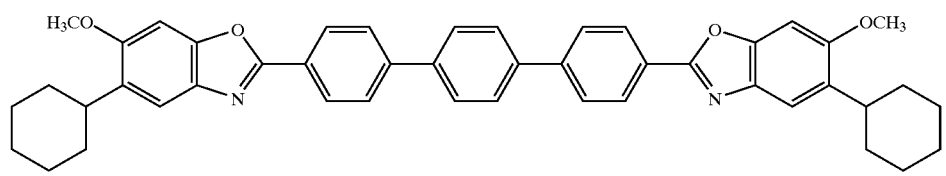
(2-39)
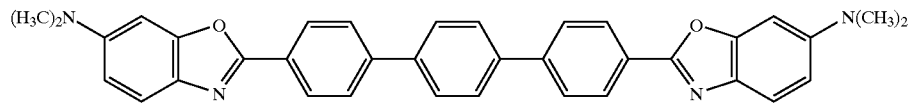
(2-40)
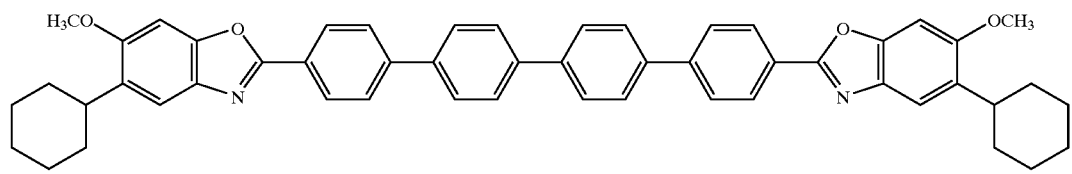
(2-41)
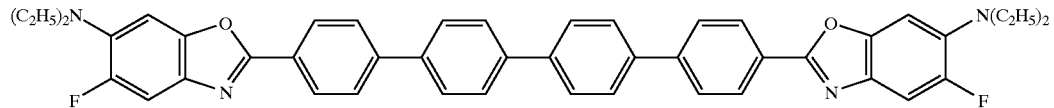
(2-42)

-continued
(2-43)
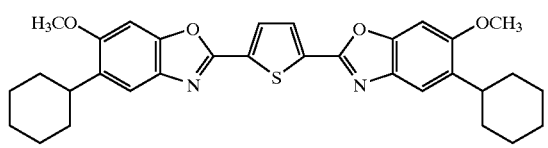
(2-44)
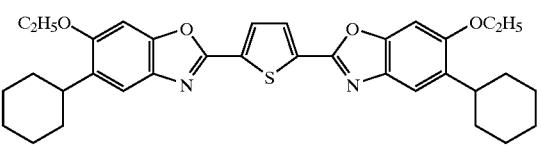
(2-46)
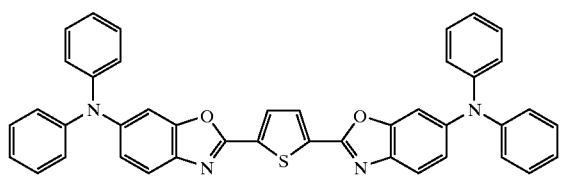
(2-45)
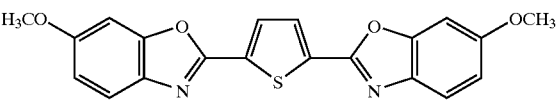
(2-47)
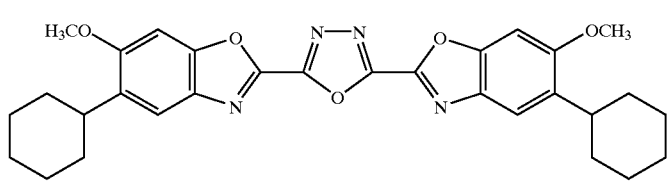
(2-48)
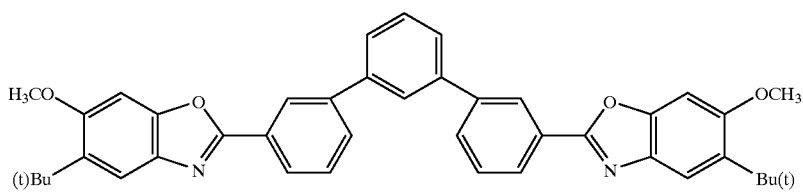
(2-49)
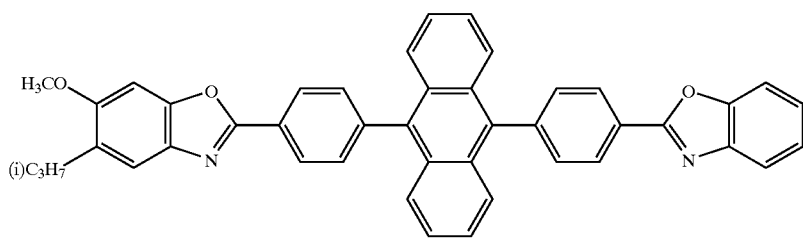
(2-50)
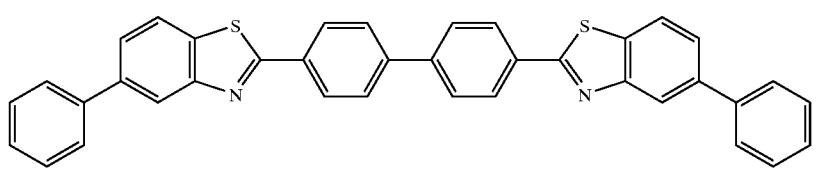
(2-51)
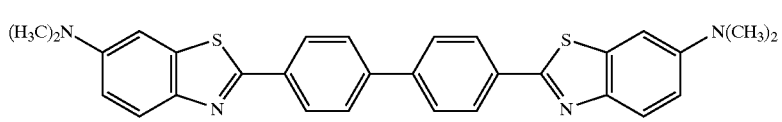
(2-52)
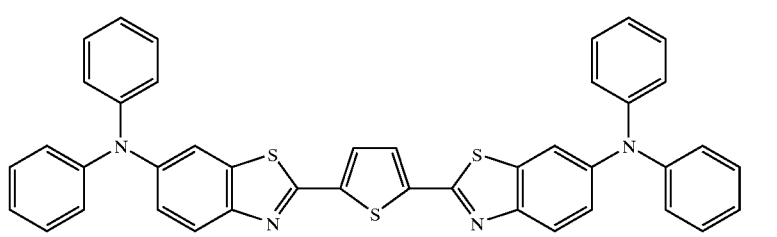

-continued
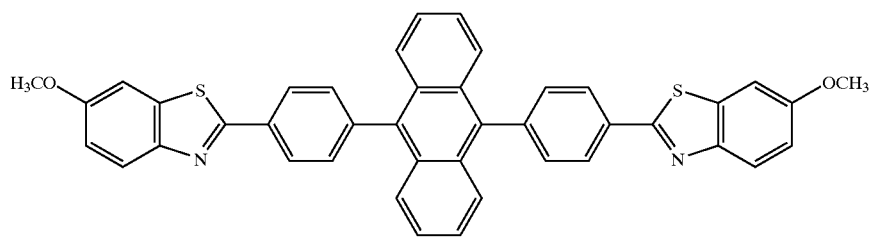
(2-53)
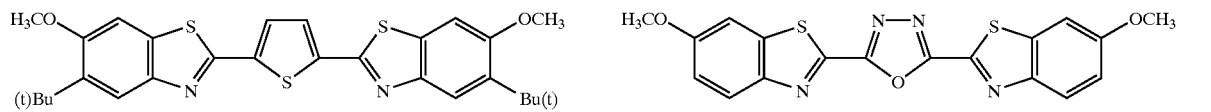
(2-54) (2-55)
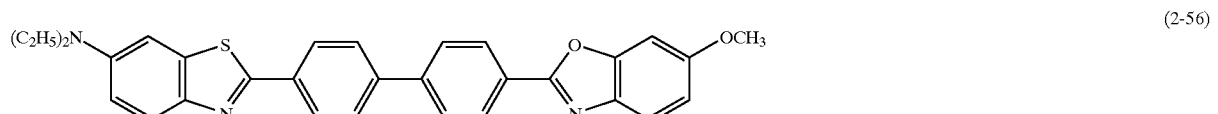
(2-56)
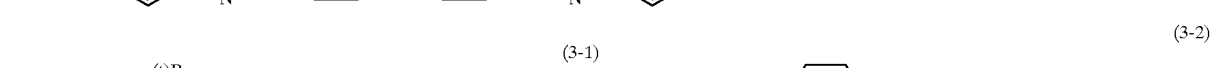
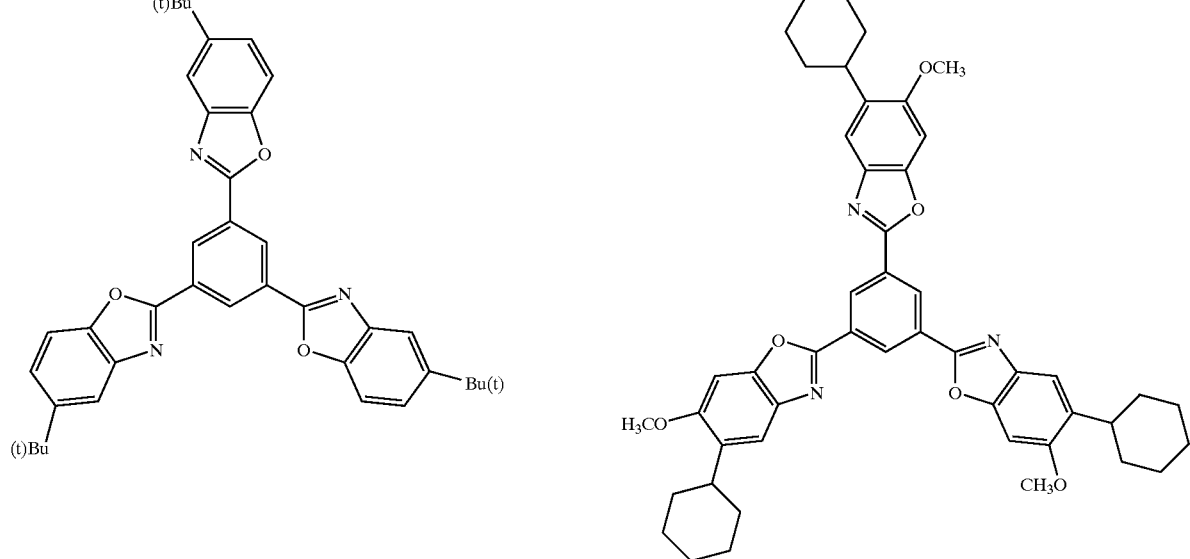
(3-1) (3-2)
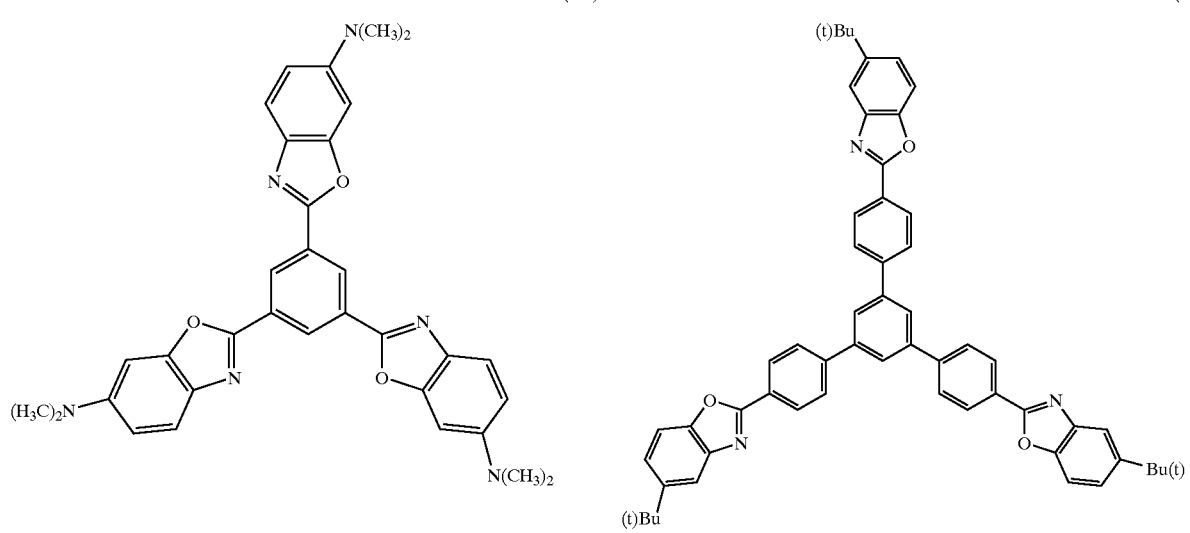
(3-3) (3-4)

-continued
(3-5)
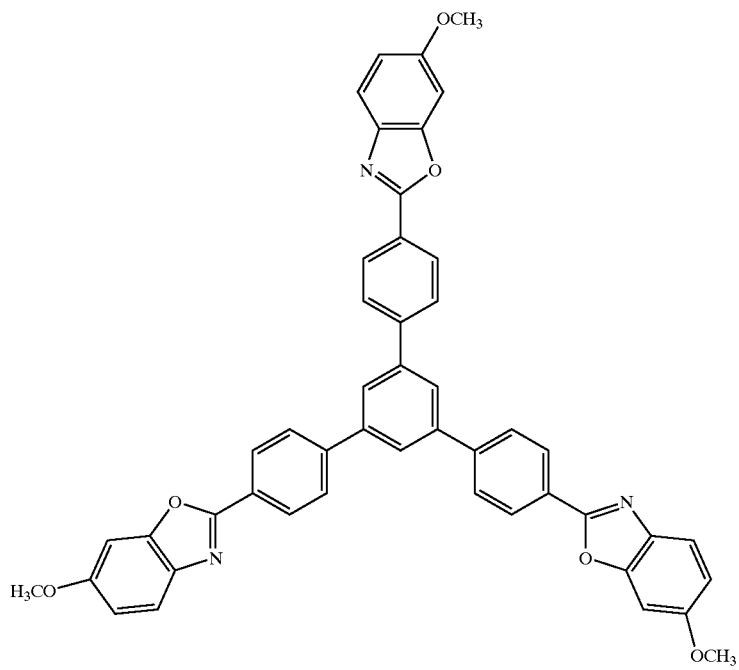
(3-6)
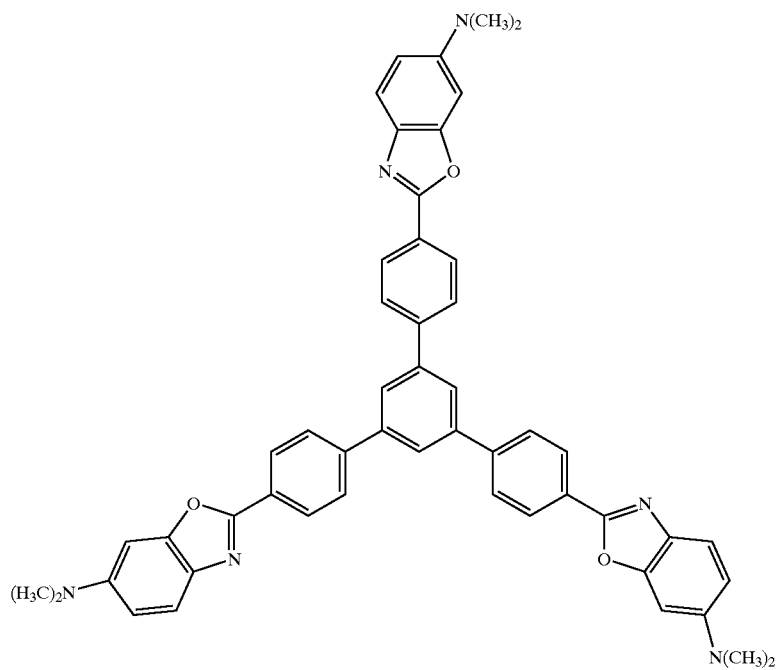

(3-7)
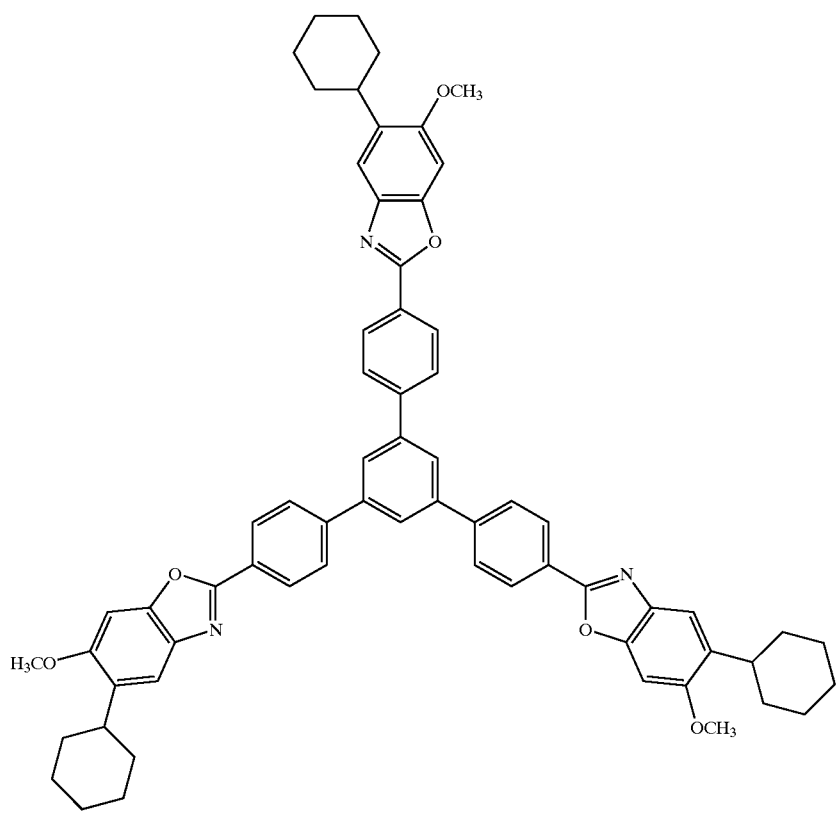
(3-8)
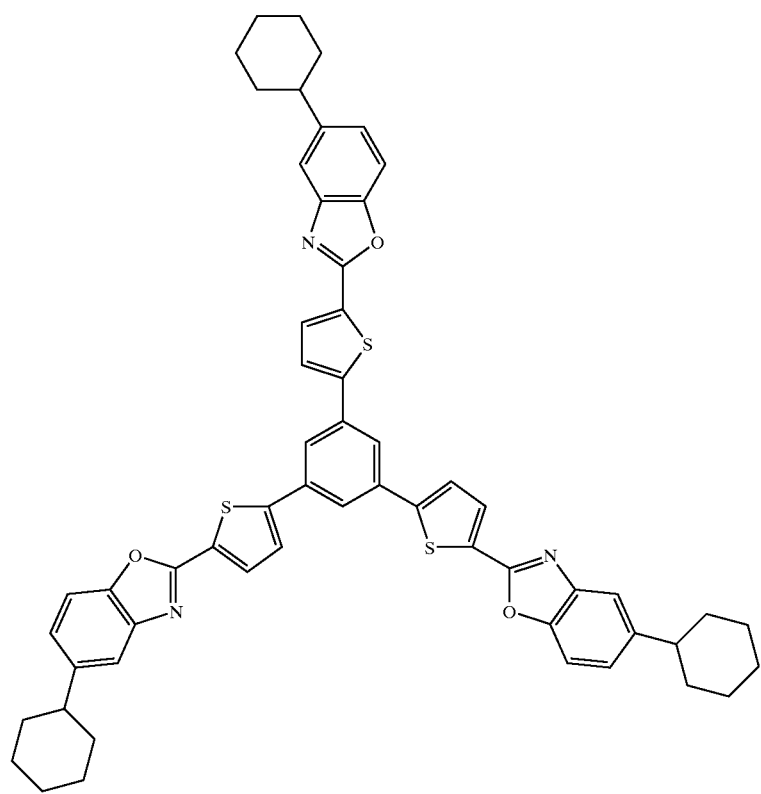

(3-9)
(3-10)
(3-11)
(3-12)
(3-13)

(3-14)
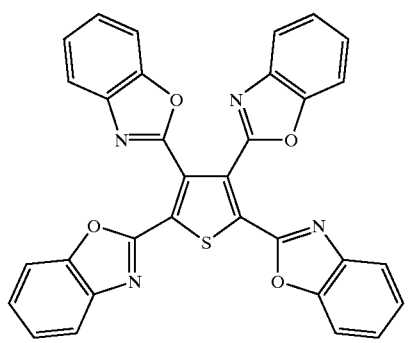
(3-15)
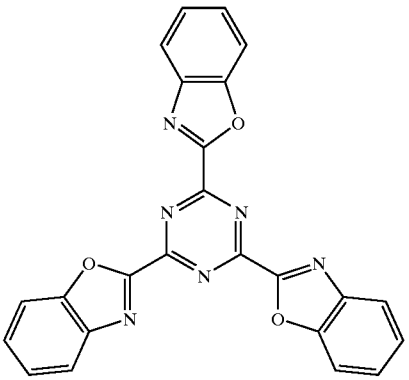
(3-16)
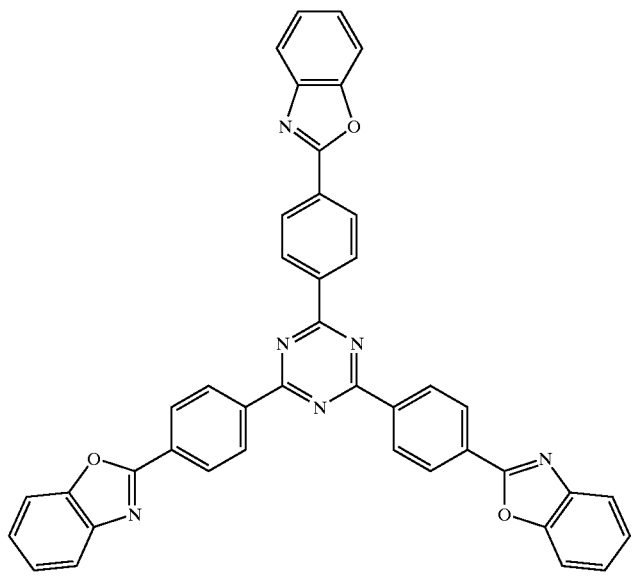
(3-17)
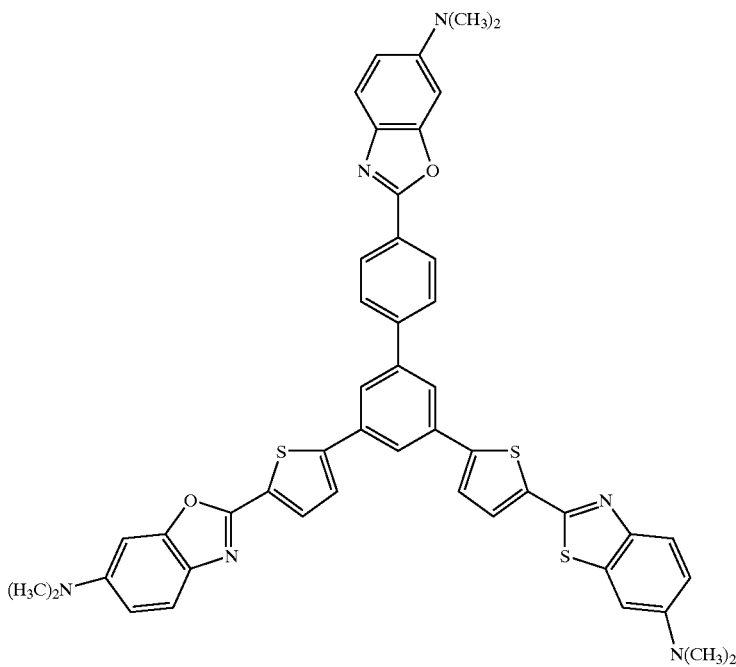

(3-18)
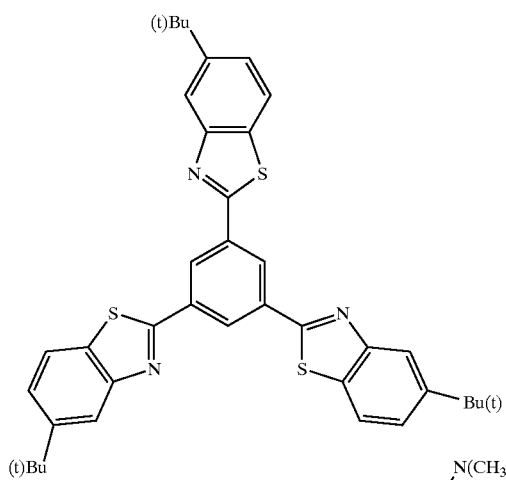
(3-19)
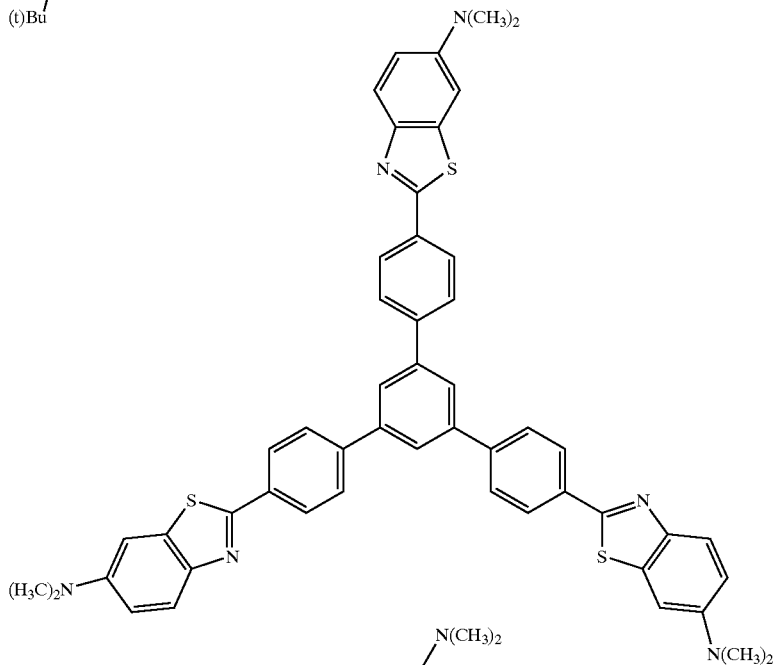
(3-20)
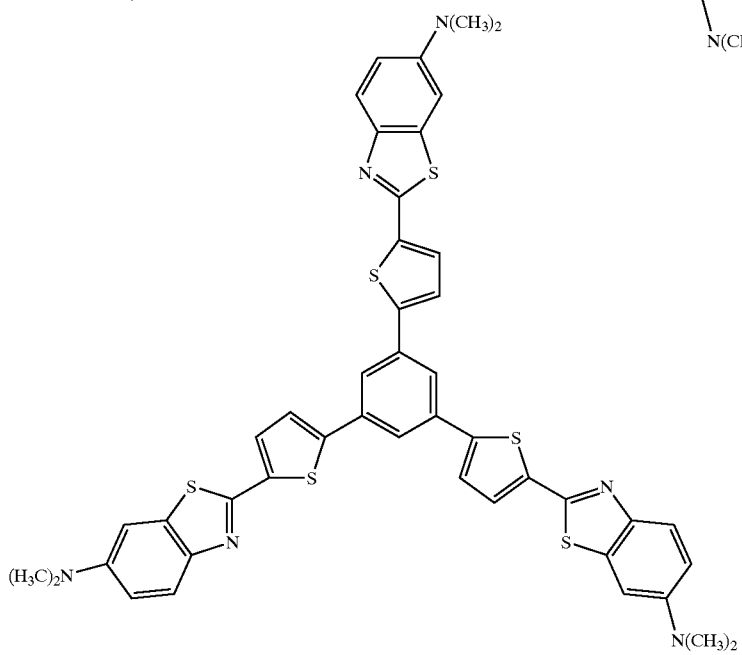

-continued
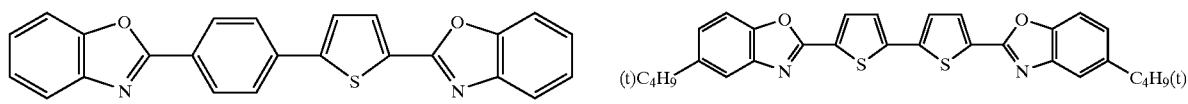 (4-1)
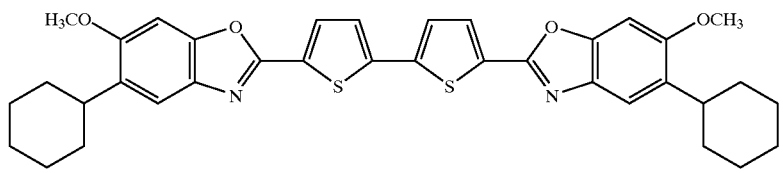 (4-2)
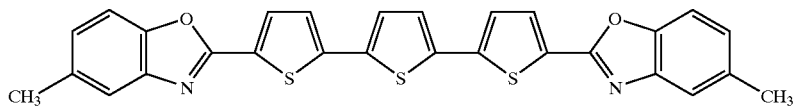 (4-3)
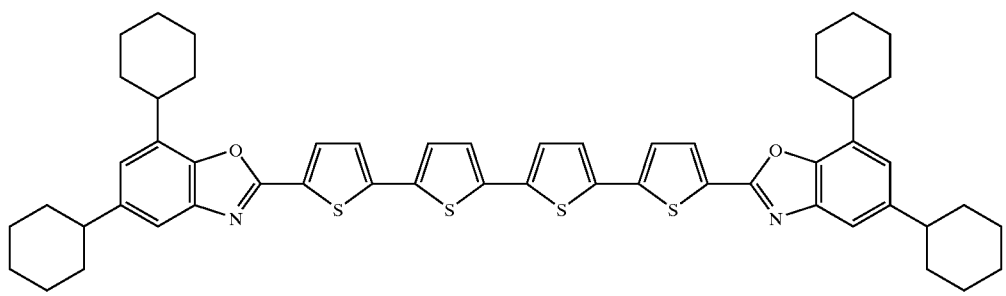 (4-4)
(4-5)
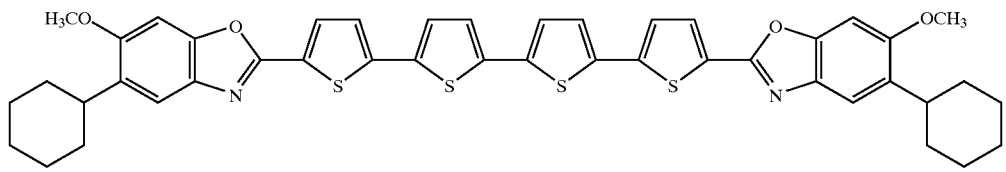 (4-6)
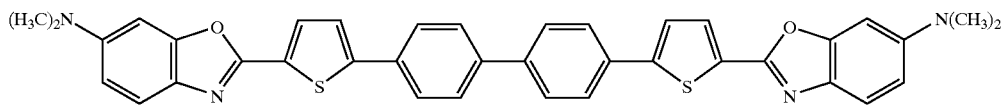 (4-7)
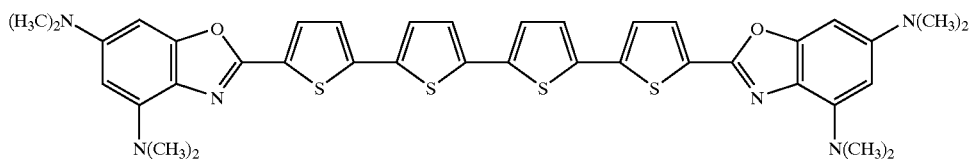 (4-8)
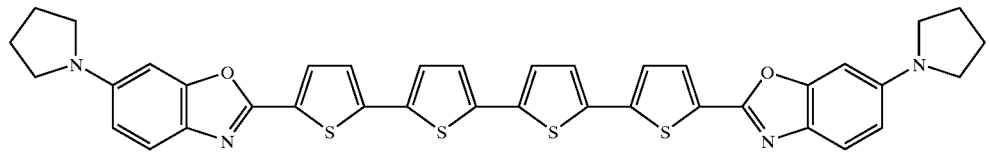 (4-9)
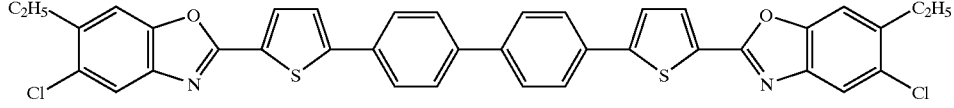 (4-10)
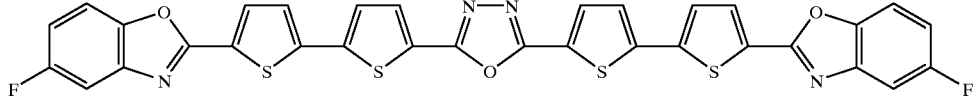 (4-11)

-continued

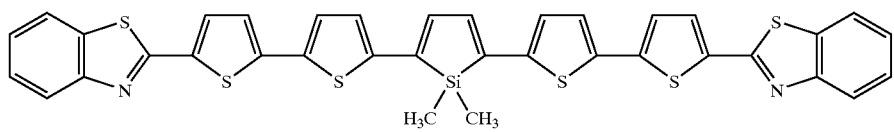
(4-12)

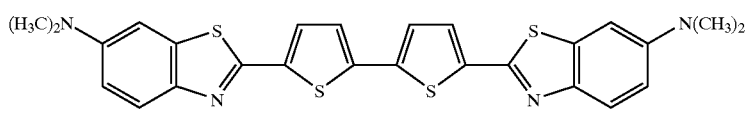
(4-13)

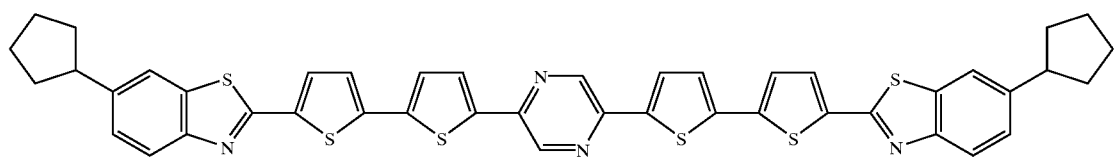
(4-14)

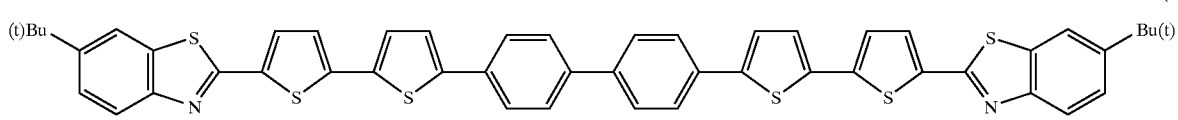
(4-15)

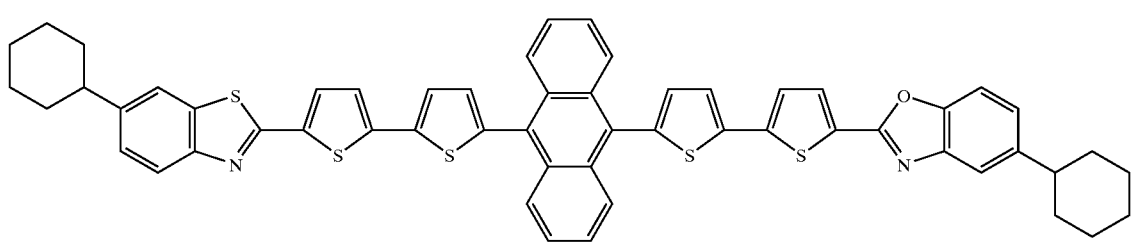
(4-16)

The compound according to the present invention represented by formula (I) can be synthesized by using benzazepines which can be synthesized according to the methods described in B. Renfroe, C. Harrington, G. R. Proctor, *The Chemistry of Heterocyclic Compounds*, Vol. 43, Part 1, John Wiley & Sons Inc. (1984), and H. C. Axtell et al., *J. Org. Chem.*, 56, 3906 (1991), by Ullmann reaction in which a metallic copper catalyst and a base can be used, or/and a cross reaction or a homo-coupling reaction using a nickel or palladium metal catalyst.

The compounds according to the present invention represented by formulae (II) to (VII) can be synthesized by applying the methods disclosed in JP-B-44-23025 (the term "JP-B" as used herein means an "examined Japanese patent publication"), U.S. Pat. No. 3,449,257, *J. Am. Chem. Soc.*, 94, 2414 (1972), JP-B-48-8842, JP-A-53-6331 (the term "JP-A" as used herein means an "unexamined published Japanese patent application"), *Helv. Chim. Acta.*, 63, 413 (1980), *Liebigs Ann. Chem.*, 1982, 1423, etc.

Representative synthesis examples are shown below.

SYNTHESIS EXAMPLE 1

Synthesis of Exemplified Compound (1-1)

Seventeen point four (17.4) grams (90 mmol) of 5H-dibenz[b,f]azepin (iminostilbene), 12.2 g (30 mmol) of 4,4'-diiodobiphenyl, 13.5 g (240 mmol) of potassium hydroxide, and 9.5 g (150 mmol) of a copper powder were mixed with 18 ml of decalin and stirred by heating under a nitrogen gas current for 28 hours at outer temperature of 200° C. After the temperature of the reaction solution was lowered to near room temperature, chloroform was added thereto, the solution was filtered through Celite to remove insoluble matters, and the filtrate was concentrated. n-Hexane was added to the residue to remove decalin, solid matters were filtered, and the obtained solid matters were crystallized with methanol, thereby 8 g of crystals containing exemplified Compound (1) was obtained. The crystals were purified by silica gel column chromatography (eluate: chloroform and n-hexane), and further recrystallized with methanol, thereby 2.5 g of pure Compound (1-1) was obtained (yield: 15.5%). Melting Point: 288–299° C.

SYNTHESIS EXAMPLE 2

Synthesis of Exemplified Compound (1-2)

Eighteen point two (18.2) grams (75 mmol) of 9H-tribenz [b,d,f]azepin (synthesized according to *J. Org. Chem.*, 56, 3906 (1991)), 10.2 g (25 mmol) of 4,4'-diiodobiphenyl, 11.2 g (200 mmol) of potassium hydroxide, and 3.2 g (50 mmol) of a copper powder were mixed with 15 ml of decalin and stirred by heating under a nitrogen gas current for 18 hours at outer temperature of 200° C. After the temperature of the reaction solution was lowered to near room temperature, chloroform was added thereto, the solution was filtered through Celite to remove insoluble matters, and the filtrate was concentrated. Methanol was added to the residue and heated, the obtained crystalline compound was filtered, and the crystalline compound was purified by silica gel column chromatography (eluate: chloroform and n-hexane), and recrystallized with a chloroform/n-hexane solution, thereby 2.4 g of crystals containing exemplified Compound (2) as a main component was obtained. However, as the purity of the obtained compound was insufficient, purification by column chromatography and recrystallization were respectively carried out one more time, thereby 1.6 g of pure Compound (1-2) was obtained (yield: 10%). Melting Point: 329–331° C.

SYNTHESIS EXAMPLE 3

Synthesis of Exemplified Compound (1-17)

Eighteen point two (18.2) grams (75 mmol) of 9H-tribenz[b,d,f]azepin, 63.7 g (225 mmol) of 1-bromo-4-iodobenzene, 5.0 g (90 mmol) of potassium hydroxide, and 2.0 g (31 mmol) of a copper powder were mixed with 50 ml of decalin and stirred by heating under a nitrogen gas current for about one week at outer temperature of 200° C. After the temperature of the reaction solution was lowered to near room temperature, chloroform was added thereto, and the solution was filtered through Celite to remove insoluble matters. Water was added to the filtrate, and the solution was subjected to extraction. The obtained concentrated reaction product was purified by silica gel column chromatography to obtain 17.4 g of 9-(4-iodophenyl)-tribenz[b,d,f]azepin (yield: 52%, a small amount of 4-bromophenyl compound was contained).

Ten point zero (10.0) grams (22.5 mmol) of 9-(4-iodophenyl)tribenz[b,d,f]azepin was dissolved in 50 ml of tetrahydrofuran, and the solution was cooled to −78° C. Fourteen point one (14.1) ml (22.5 mmol) of a 1.6 M hexane solution containing n-butyl lithium was dropwise added thereinto. After completion of the addition, the solution was stirred for 30 minutes, and then a tetrahydrofuran solution containing 2.8 g (22.5 mmol) of trimethyl borate was dropwise added thereto over about one hour. After completion of the addition, the solution was stirred for 1 hour, then the temperature was gradually raised to room temperature, and the solution was allowed to react for further two hours. Subsequently, a dilute sulfuric acid (3 ml of sulfuric acid and 50 ml of water) was added at 0° C. and hydrolysis was performed. The reaction solution was extracted with ethyl acetate, concentrated under reduced pressure, the obtained solid of boronic acid was recrystallized with toluene and purified, thereby 6.1 g of 4-(tribenz[b,d,f]azepin-9-yl)phenyl boronic acid was obtained (yield: 75%).

A mixture of 5.0 g (14 mmol) of 4-(tribenz[b,d,f]-azepin-9-yl)phenyl boronic acid, 2.7 g (4.3 mmol) of tris(4-iodophenyl)amine, 13 mg (0.057 mmol) of palladium acetate, 43 mg (0.14 mmol) of tri-o-tolylphosphine, 1.5 g (1.1 mmol) of triethylamine, and 60 ml of N,N-dimethylformamide was heated at 100° C. for about four hours. The solvent was distilled off under reduced pressure, and then chloroform and a 10% aqueous solution of ammonia was added thereto, followed by extraction. The extract was dried over magnesium sulfate anhydride, filtered, and concentrated under reduced pressure. After the obtained residue was purified by silica gel column chromatography, recrystallized with a tetrahydrofuran/methanol solvent, thereby 2.1 g of exemplified Compound (1-17) was obtained (yield: 40%). Melting Point: 300° C. or more.

SYNTHESIS EXAMPLE 4

Synthesis of Exemplified Compound (1-23)

Fourteen point seven (14.7) grams (33 mmol) of 9-(4-iodophenyl)tribenz[b,d,f]azepin obtained according to the method described in Synthesis Example 3 was dissolved in tetrahydrofuran, then cooled to −78° C. under an argon gas current. Thereinto was dropwise added 15.2 ml (38 mmol) of an n-hexane solution, followed by stirring for 30 minutes. Subsequently, 3.9 ml (50 mmol) of dimethylformamide was dropwise added thereto, then the reaction solution was stirred for about one hour and the temperature was gradually raised to room temperature. A dilute sulfuric acid was added to the reaction solution, and the solution was subjected to extraction with chloroform. The concentrate was purified by silica gel column chromatography, thereby 8.6 g of 9-(4-formylphenyl)tribenz[b,d,f]azepin was obtained (yield: 75%).

Three point zero (3.0) grams (25.0 mmol) of a 95% solution of potassium t-butoxide was added to 50 ml of a dimethyl sulfoxide solution containing 8.0 g (23.0 mmol) of 9-( 4-formylphenyl)tribenz[b,d,f]azepin and 7.6 g (25.0 mmol) of diphenylmethyl phosphonic acid diethyl, and the solution was stirred at room temperature for about 10 hours. Water was added to the reaction solution, followed by extraction with chloroform, the extract was concentrated, and the concentrate was purified by column chromatography to thereby obtain 8.0 g of exemplified Compound (1-23) as white crystals (yield: 70%). Melting Point 222–223° C.

SYNTHESIS EXAMPLE 5

Synthesis of Exemplified Compound (2-13)

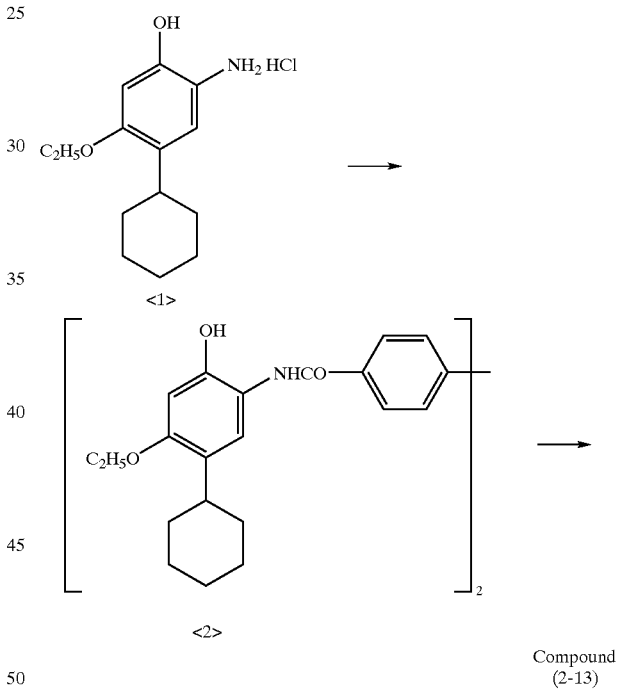

An acetonitrile solution (100 ml) containing 2.3 g (8.4 mmol) of 4,4'-biphenyldicarbonyl chloride was stirred at room temperature, and 5.0 g (18.4 mmol) of 2-amino-4-cyclohexyl-5-ethoxyphenol hydrochloride <1> (synthesized according to the method disclosed in JP-A-56-100771) was added to the reaction solution. Then, 3.7 ml (26.9 mmol) of triethylamine was dropwise added thereto and the reaction system was refluxed with heating for about 2 hours. The temperature of the reaction solution was lowered to room temperature, water was added to the solution, the precipitated pale brown crystals were filtered by suction and thoroughly washed with methanol. The obtained crystal was amide compound <2> and the yield was 4.3 g (75.7%).

A toluene solution (100 ml) containing 4.0 g (5.9 mmol) of Compound <2> and 3.3 g (17.3 mmol) of p-toluenesulfonic acid monohydrate was refluxed with heating for about 16 hours with removing water using Dean-Stark device. The temperature was lowered to room temperature, thereby crystals were precipitated. The crystals were filtered by suction and washed with toluene, as a result, yellow crystals were obtained. These crystals were put in a beaker, a saturated aqueous solution of sodium hydrogen carbonate was added to the beaker, stirred, filtered by suction again, washed with water, and then dried, thereby 2.1 g of exemplified Compound (2-13) was obtained as a little greenish pale yellow crystals (yield: 55%). Melting Point: 259–260° C. (recrystallized with tetrahydrofuran).

SYNTHESIS EXAMPLE 6

Synthesis of Exemplified Compound (2-22)

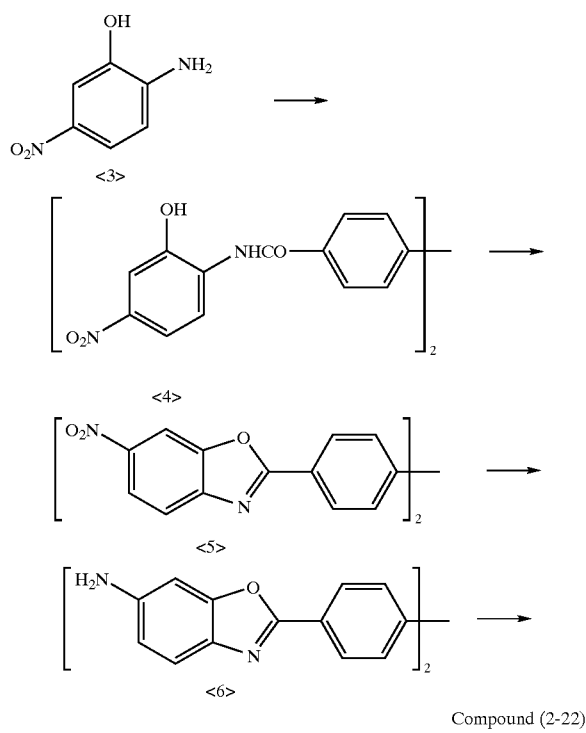

Compound (2-22)

Ten point zero (10.0) grams (35.8 mmol) of 4,4'-biphenyldicarboxylic acid chloride was added to an acetonitrile solution (100 ml) containing 12.1 g (78.8 mmol) of 2-amino-5-nitrophenol and stirred. Eight point zero (8.0) grams (78.8 mmol) of triethylamine was dropwise added thereto and stirred for about 2 hours. The precipitated crystals were filtered, washed with acetonitrile and dried, as a result, 17.0 g of yellow crystals Compound <4> was obtained (yield: 92.3%).

Two hundred (200) ml of DMI (1,3-dimethyl-2-imidazolidinone) and 100 ml of toluene were added to 15.0 g of Compound <4>, further, 16.6 g (87.5 mmol) of p-toluenesulfonic acid monohydrate was added thereto and refluxed with heating for about 15 hours. The water was removed from the reaction solution using Dean-Stark device while refluxing with heating. After the temperature of the reaction system was lowered to room temperature, the precipitated crystals were filtered and dried, thereby 12.1 g of Compound <5> was obtained as yellow powder crystals (yield: 76.5%).

Five point eight (5.8) grams (105 mmol) of reduced iron was added to 100 ml of isopropanol, 0.6 g (10.5 mmol) of ammonium chloride and 30 ml of water were added thereto and refluxed with heating for about 30 minutes. The reflux with heating was stopped for the time being, 5.0 g (10.5 mmol) of Compound <5> was added to the reaction solution, and further 300 ml of DMF (N,N-dimethylformamide) was added. The reaction solution was refluxed with heating for about 6 hours, then the solution was cooled to about 50° C., and the solution was filtered through Celite to remove insoluble matters. The filtrate was concentrated using an evaporator to remove isopropanol and water. To the thus-obtained residue containing Compound <6>, 50 g (320 mmol) of iodoethane and 20 g (145 mmol) of potassium carbonate were added, followed by reaction at 65 to 75° C. for about 20 hours. Chloroform and water were added to the reaction solution, the reaction solution was filtered through Celite, and then subjected to extraction. The extract was dried over magnesium sulfate anhydride, filtrated and concentrated, thereby a crystalline compound was obtained. Methanol was added to the compound, mixed by stirring, and filtered by suction to obtain 3.8 g of yellow crystals containing exemplified Compound (22) as a main component. The obtained crystals were purified by silica gel column chromatography (eluate: chloroform), and further recrystallized with tetrahydrofuran, thereby 2.0 g of pure Compound (2-22) could be obtained (yield: 35.9%). Melting Point: 232–233° C.

SYNTHESIS EXAMPLE 7

Synthesis of Exemplified Compound (2-41)

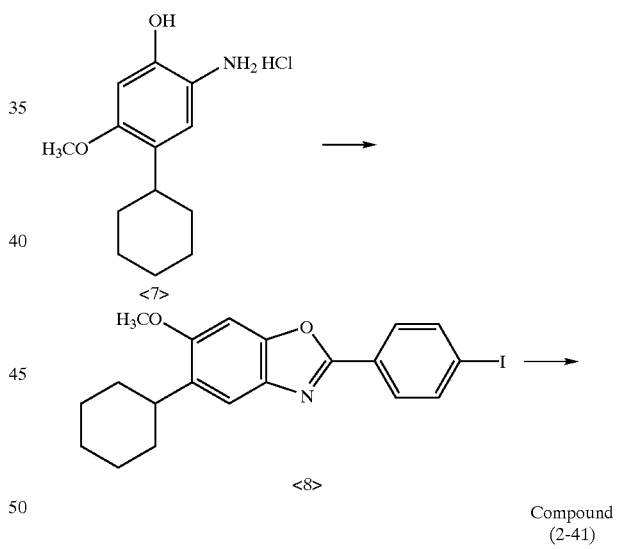

Compound (2-41)

Seventeen point three (17.3) grams (70 mmol) of 4-iodobenzoic acid was added in 100 ml of NMP (N-methylpyrrolidone), and ice-cooled at about 10° C. and stirred. Five point nine (5.9) ml (81 mmol) of thionyl chloride was dropwise added thereto, and after completion of the dropwise addition, the solution was stirred for about 2 hours. Subsequently, 15.0 g (58 mmol) of Compound <7> was added to the reaction solution and stirred for about 2 hours. Water was added to there action solution, followed by extraction with chloroform two times. The extract in total was washed with an aqueous solution of sodium hydroxide (pH: 8) and saturated brine, dried over magnesium sulfate anhydride, filtrated, and then concentrated. One hundred (100) ml of toluene and 2.2 g (12 mmol) of p-toluenesulfonic acid monohydrate were added to the concentrated solution containing NMP, and the solution was dehydrated while removing the toluene using Dean-Stark device. When almost all the toluene was removed, 100 ml of chlorobenzene was added thereto and refluxed with heating for about 15 hours. Water and chloroform were added to the reaction solution, followed by extraction. Methanol was added to the obtained crystalline compound and filtered, thereby 21.6 g of pale yellowish brown Compound <8> was obtained (yield: 86.1%).

Five (5) grams (11.5 mmol) of Compound <8>, 1.4 g (5.8 mmol) of 4,4'-biphenyldiboronic acid, and 0.1 g (0.087 mmol) of tetrakistriphenylphosphine palladium were put in a flask, 11.5 ml (23 mmol) of 2 M aqueous solution of sodium carbonate and 80 ml of toluene were added thereto, and refluxed with heating under a nitrogen gas current. As the reaction solution did not mix well, 90 ml of DMF and 30 ml of water were added thereto, and refluxed with heating for about 20 hours. The reaction solution was cooled to room temperature and water was added, thereby crystals were precipitated. The crystals were washed with methanol. The obtained crystals were further subjected to extraction with chloroform using Soxhlet extractor, thereby 2.7 g of exemplified Compound (2-41) could be obtained as pure crystals (yield: 61.4%). Melting Point: 275–276° C.

SYNTHESIS EXAMPLE 8

Synthesis of Exemplified Compound (2-43)

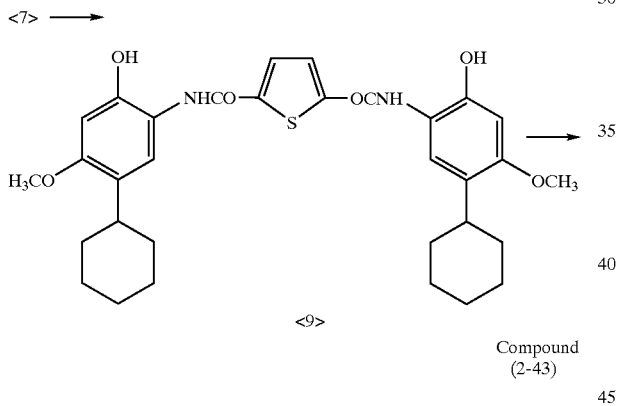

Compound (2-43)

In the same manner as in Synthesis Example 3, 3.4 ml (46.6 mmol) of thionyl chloride was subjected to reaction with an NMP solution containing 6.7 g (38.8 mmol) of 1,5-thiophenedicarboxylic acid to synthesize acid chloride, 20 g (77.6 mmol) of Compound <7> was added thereto and stirred at room temperature. Ten point eight (0.8) ml (77.6 mmol) of triethylamine was dropwise added thereto, stirred for about 30 minutes, then heated to 60° C., and allowed to react for further about 1 hour. The temperature of the reaction solution was then lowered to room temperature and subjected to extraction with ethyl acetate. The extract was dried over magnesium sulfate anhydride and concentrated. Chloroform was added to the thus-obtained crystalline residue, stirred, filtered, and dried, thereby 15.7 g of Compound <9> of yellow powder crystals was obtained (yield: 70%). Compound <9> is easily soluble in ethyl acetate and tetrahydrofuran but hardly soluble in chloroform.

Ten (10) ml of DMI was added to 150 ml of a chlorobenzene solution containing 8.2 g (14.2 mmol) of Compound <9> and 0.54 g (2.83 mmol) of p-toluenesulfonic acid monohydrate and refluxed with heating for about 40 hours. As the reaction rate was slow, 0.54 g of p-toluenesulfonic acid monohydrate was added two times en route. Water was added to the reaction solution, the solution was subjected to extraction with a little large amount of chloroform, dried over magnesium sulfate anhydride and concentrated, thereby brown crystals were obtained. The crystals were dissolved in chloroform after being heated a little, and purified by column chromatography with a little large amount of silica gel. The obtained orange crystals were recrystallized with a chloroform/ethanol solvent, thereby 4.8 g of exemplified Compound (2-43) could be obtained as orange powder crystals (yield: 62%). Melting Point: 276–278° C.

SYNTHESIS EXAMPLE 9

Synthesis of Exemplified Compound (3-1)

Twelve point seven (12.7) grams (76.9 mmol) of 2-amino-4-t-butylphenol was dissolved in 100 ml of NMP (N-methylpyrrolidone), 6.8 g (25.6 mmol) of 1,3,5-benzene-tricarboxylic acid chloride was added thereto at room temperature, the solution was stirred for about one hour, then allowed to stand overnight. Fourteen point six (14.6) grams (76.9 mmol) of p-toluenesulfonic acid monohydrate and 100 ml of toluene were added thereto, and the reaction solution was refluxed with heating for about 15 hours while removing the water using Dean-Stark device. After being allowed to stand overnight, crystals were precipitated. Methanol was added to the precipitate, filtered, and dried, thereby 14.7 g of almost pure exemplified Compound (3-1) was obtained as colorless powder crystals. The almost pure exemplified Compound (3-1) was recrystallized with a tetrahydrofuran/methanol solvent. Thus, 13.7 g of pure exemplified Compound (3-1) could be obtained (yield: 89.5%). Melting Point: 309–310° C.

SYNTHESIS EXAMPLE 10

Synthesis of Exemplified Compound (3-7)

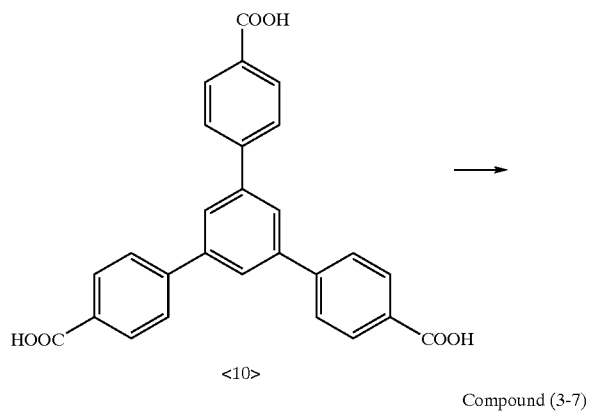

Compound (3-7)

In the same manner as in Synthesis Example 3, acid chloride was synthesized from 2.3 g (5.2 mmol) of Compound <10> and 2.2 g (18.7 mmol) of thionyl chloride, 4.8 g (18.7 mmol) of Compound <7> was added thereto, then the solution was heated at 70 to 90° C. for about 10 hours, and allowed to stand overnight at room temperature. p-Toluenesulfonic acid monohydrate (0.7g) (3.8 mmol) and 100 ml of chlorobenzene were added to the solution and refluxed with heating for about 13 hours. Chlorobenzene and NMP were removed under reduced pressure as far as possible. The residue was purified by silica gel column chromatography, and then recrystallized with a tetrahydrofuran/ethanol solvent, thereby 2.7 g of exemplified Compound (3-7) could be obtained as colorless crystals (yield: 52%). Melting Point: 230–233° C.

SYNTHESIS EXAMPLE 11

Synthesis of Exemplified Compound (4-3)

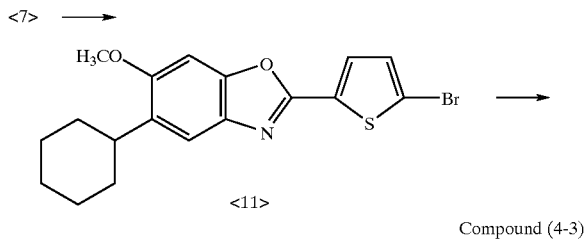

Compound (4-3)

Five point three (5.3) ml (72 mmol) of thionyl chloride was added to 100 ml of a toluene solution containing 10 g (48 mmol) of 4-bromothiophene-2-carboxylic acid and refluxed with heating for about 3 hours. After then, one drop of DMF was added to the solution and further refluxed with heating for 2 hours. After the reaction solution was concentrated under reduced pressure, 12.4 g (48 mmol) of Compound <7>, 100 ml of toluene and 50 ml of DMP were added, the reaction solution was stirred at 20° C. initially, and the temperature was increased gradually to 100° C. The solution was refluxed with heating for about 30minutes, then 9.1 g (48 mmol) of p-toluenesulfonic acid monohydrate was added, and then refluxed with heating for about 10 hours while dehydrating using Dean-Stark device. Water was added after the temperature of the solution was lowered to room temperature, subjected to extraction with chloroform three times, the extract was dehydrated with magnesium sulfate anhydride and concentrated under reduced pressure, thereby a crystalline compound was obtained. Methanol and ethyl acetate were added to the compound, stirred, filtrated, and then dried. Thus, 15.1 g of almost pure Compound <11> can be obtained (yield: 80%).

To 50 ml of an NMP solution containing 5.0 g (12.7 mmol) of Compound <11> and 200 mg (0.5 mmol) of bistriethylphosphine nickel chloride, 830 mg (12.2 mmol) of zinc and4.2 g (25.4 mmol) of potassium iodide were added, and the temperature was gradually raised from room temperature to about 70° C. under a nitrogen gas current. The reaction solution was stirred at 70° C. for about 10 hours, then water was added, subjected to extraction with chloroform, dried, concentrated, purified by silica gel column chromatography, and recrystallized with a tetrahydrofuran/methanol solvent. Thus, 1.4 g of exemplified Compound (4-3) was obtained (yield: 35%). Melting Point: 297–300° C.

The constitution of the organic electroluminescence element according to the present invention comprises a substrate having provided thereon at least the anode for injecting holes, at least one organic compound layer, and the cathode for injecting electrons. It is necessary for the organic compound layer to have a luminescent region, accordingly when the organic compound layer of the organic electroluminescence element comprises only a single layer, the organic compound according to the present invention represented by formula (I) and the organic compound according to the present invention represented by formula (II) (III) or (IV) are contained in the same layer and they form a layer undertaking transporting of carriers and luminescence. Further, it is possible to adopt a lamination structure wherein if the luminescent layer having a luminescent region of the organic compound layer is short of transporting property of holes, a hole-transporting layer is provided between the organic compound layer and ITO, or when short of transporting property of electrons, an electron-transporting layer is provided between the organic compound layer and the cathode. It is preferred that the compound represented by formula (I) according to the present invention be used as a hole-transporting material and the compound represented by formula (II), (III) or (IV) according to the present invention be used as a luminescent material or an electron-transporting material. As the compound represented by formula (I) according to the present invention shows good hole-transporting property, and the deposited film is uniform and shows excellent adhesive property, it is preferred to be formed as a hole-transporting layer on the anode such as ITO by a resistance heating deposition method, etc. Further, it is possible for the organic compound according to the present invention to form a laminated film with other materials showing hole-transporting property, or form a mixed film by a co-deposition method, etc. It is also possible to adopt the structure in which luminescent materials and materials having electron-transporting property are mixed in a hole-transporting layer, alternatively, these compounds can be dispersed in resins such as polystyrene or polycarbonate and formed as a dispersion film by spin coating or dip coating.

As the compounds represented by formula (II), (III) or (IV) according to the present invention have high fluorescent strength and excellent electron-transporting property, they can be used alone to form a luminescent layer, or as they show very strong fluorescence even in a solution, they efficiently work as a dopant which is on the guest side in a host-guest system. Further, when the quenching due to concentration is strong, they are used as a mixed layer with other organic compounds by being doped in a trace concentration of several mol % or less. The organic compounds according to the present invention are excellent in electron-transporting property and function as electron-transporting luminescent materials which transport electrons from the cathode when used as a luminescent layer. Therefore, by making the best use of their electron-transporting property, they can be used as an electron-transporting layer in laminated structure or a mixed layer with other organic compounds having a luminescent region. Moreover, the structure in which other materials having hole- and electron-transporting properties are mixed in a luminescent layer can also be selected. Alternatively, these compounds can be dispersed in resins such as polystyrene or polycarbonate and formed as a dispersion film by spin coating or dip coating.

In general, an organic electroluminescence element takes the lamination structure in which each layer bears its function in view of efficient injection and recombination of electrons. Materials which are used for each layer are shown below.

As hole-transporting materials, aromatic diamine compounds, such as N,N'-diphenyl-N,N'-bis(3-methylphenyl)-1,1'-diphenyl-4,4'-diamine (TDP), are generally used. Examples of other compounds which are used as a hole-transporting material include, as disclosed in JP-A-4-129191, JP-A-4-255692 and JP-A-4-132189, porphyrin compounds, such as porphine, tetraphenylporphine copper, phthalocyanine, copper phthalocyanine, titanium phthalocyanine oxide, etc.; aromatic tertiary amines, such as 1,1- bis[4-(di-p-tolylamino)-phenyl]cyclohexane, 4,4',4"-trimethyltriphenylamine, N,N,N',N'-tetrakis(p-tolyl)-p-phenylenediamine, 1-(N,N-di-p-tolylamino)naphthalene, 4,4'-bis(dimethylamino)-2,2'-dimethyltriphenymethane, N,N,N',N'-tetraphenyl-4,4'-diamino-biphenyl, N,N'-diphenyl-N,N'-di-m-tolyl-4,4'-diaminobiphenyl, N-phenylcarbazole, etc.; stilbene compounds, such as 4-di-p-tolylamino stilbene, 4-(di-p-tolylamino)-4'-[4-(di-p-tolylamino)styryl], etc.; triazole derivatives; oxadiazole derivatives; imidazole derivatives; polyarylalkane derivatives; pyrazoline derivatives; pyrazolone derivatives; phenylenediamine derivatives; arylamine derivatives; amino-substituted chalcone derivatives; oxazole derivatives; styrylanthracene derivatives; fluorenone derivatives; hydrazone derivatives; silazane derivatives; polysilane/aniline copolymers; high molecular oligomers; styrylamine compounds; aromatic dimethylidyne compounds; poly-3-methylthiophene, etc. They can also be used as high polymer dispersions dispersed in high polymers such as polycarbonate.

As luminescent materials, compounds comprising fluorescent materials and having good film-forming property, such as Alq described above concerning the prior art technique which has fluorescence in the visible region, are preferably used. Many compounds which are used as luminescent materials of organic electroluminescence elements also have electron-transporting property and they can also be used in combination with the compounds of the present invention as an electron-transporting layer or a mixed layer. That is, benzothiazole-based, benzimidazole-based, and benzoxazole-based brightening agents, disclosed, e.g., in JP-A-4-255692, metal-chelated oxinoid compounds, and stilbene (styrylbenzene) compounds can be exemplified. Representative examples of brightening agents include brightening agents of benzoxazole-based, such as 2,5-bis(5,7-di-t-pentyl-2-benzoxazolyl)-1,3,4-thiadiazole, 4,4'-bis(5,7-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis[(5-α,α-dimethyl-benzyl)-2-benzoxazolyl]thiophene, 2,5-bis[5,7-di(2-methyl-2-butyl)-2-benzoxazolyl]-3,4-diphenylthiophene, 2,5-bis(5-methyl-2-benzoxazolyl)thiophene, 4,4'-bis(2-benzoxazolyl)-biphenyl, 5-methyl-2-{2-[4-(5-methyl-2-benzoxazolyl)phenyl]-vinyl}benzoxazole, and 2-[2-(4-chlorophenyl)vinyl]naphtho-[1,2-d]oxazole, benzothiazole-based, such as 2,2'-(p-phenylenedivinylene)-bisbenzothiazole, and benzimidazole-based, such as 2-{2-[4-(2-benzimidazolyl)phenyl]vinyl}benzimidazole, and 2-[2-(4-carboxyphenyl)vinyl]benzimidazole.

Examples of metal-chelated oxinoid compounds include 8-hydroxyquinoline-based metal complexes, such as tris(8-quinolinol)aluminum, bis(8-quinolinol)magnesium, bis(benzo-[f]-8-quinolinol)zinc, bis(2-methyl-8-quinolinolate) aluminum oxide, tris(8-quinolinol)indium, tris(5-methyl-8-quinolinol)-aluminum, 8-quinolinollithium, tris(5-chloro-8-quinolinol)-gallium, bis(5-chloro-8-quinolinol)calcium, and poly[zinc(II)-bis(8-hydroxy-5-quinolinonyl)methane, and dilithium epindolidione, etc. Examples of stilbene compounds include 1,4-bis(2-methylstyryl)benzene, 1,4-(3-methylstyryl)benzene, 1,4-bis(4-methylstyryl)benzene, distyrylbenzene, 1,4-bis(2-ethylstyryl)benzene, 1,4-bis(3-ethylstyryl)benzene, and 1,4-bis(2-methylstyryl)-2-methylbenzene. Distyrylpyrazine derivatives can also be used and specific examples thereof include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl) pyrazine, 2,5-bis[2-(4-biphenyl)vinyl]pyrazine, and 2,5-bis [2-(1-pyrenyl)vinyl]pyrazine. In addition, naphthalimide derivatives, perylene derivatives, oxadiazole derivatives, aldazine derivatives, cyclopentadiene derivatives, styrylamine derivatives, coumalin derivatives, aromatic dimethylidyne derivatives, and anthracene, salicylate, pyrene, coronene as disclosed in JP-A-4-132189 can be exemplified.

The organic compounds according to the present invention can also form a luminescent layer with the above-described organic materials which exhibit fluorescence by the guest-host system according to a doping method.

As materials for the cathode, metals or alloys having a low work function are used, e.g., Ak, In, Mg, Ti, Mg/Ag alloy and Al/Li alloy. In some cases, a sequestering film is provided on the cathode by deposition, sputtering or coating for preventing the influence of oxygen and moisture in the air. As materials for that purpose, an inorganic oxide such as SiO, $SiO_2$, $Al_2O_3$, thermosetting resins, photocurable resins, and silane-based high polymers having a sealing effect can be exemplified.

The organic electroluminescence element according to the present invention is specifically described below with referring to examples.

EXAMPLE 1

Organic electroluminescence elements were prepared using exemplified compounds according to the present invention as a hole-transporting layer and a luminescent layer. On thoroughly washed ITO (manufactured by Asahi Glass Co., Ltd., sheet resistance: 15 Ω), each exemplified compound represented by formula (I) according to the present invention (as shown in Table 1) was deposited from the board made of tantalum at depositing rate of from 0.1 to 0.2 nm/sec in thickness of 50 nm, and exemplified Compound (2-10) was deposited thereon from the board made of tantalum at depositing rate of from 0.1 to 0.2 nm/sec in thickness of 60 nm. Further, Al-Li alloy (manufactured by Ko-Jundo Kagaku Co., Ltd., Li concentration: 15 at %) was deposited thereon from the board made of tungsten at depositing rate of 0.5 nm/sec in film thickness of 200 nm to form an organic electroluminescence element. For the comparison of luminance, each characteristic of voltage, luminance, and electric current of each element were measured using BM-8 luminescent meter manufactured by Topcon Co., Ltd., source measuring unit 236 manufactured by Keithley Instruments Inc as the electric source, and the positive electrode was connected to ITO and the negative electrode to the cathode. Luminescent spectrum of each element was measured using LS-50B manufactured by Perkin Elmer Co., Ltd. Further, for measuring driving life of elements, each element was connected to a constant current electric source (source measuring unit 236manufactured by Keithley Instruments Inc), and continuous driving test of each element was conducted. As driving conditions of the continuous driving test, the electric current value was set such that the initial luminance of the element having a luminescent area of 8 mm$^2$ became 100 cd/m$^2$ by constant current driving. Evaluation was carried out taking the time required for the initial luminance of the element to become half as half value period. The results obtained are shown in Table 1 below.

α-NPD

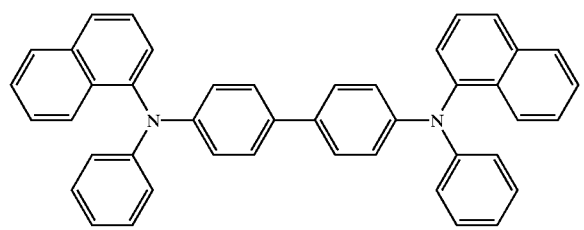

0.1 to 0.2 nm/sec in thickness of 50 nm, and each of Compounds (A) to (E) shown below which are included in the compound regulation disclosed in JP-A-59-194393 by Eastman Kodak Co. or JP-A-5-343184 by Fuji Xerox Co., Ltd. was deposited thereon as the luminescent layer from the board made of tantalum at depositing rate of from 0.1 to 0.2 nm/sec in thickness of 60 nm. Further, Al-Li alloy (manufactured by Ko-Jundo Kagaku Co., Ltd., Li concentration: 15 at %) was deposited thereon from the board made of tungsten at depositing rate of 0.5 nm/sec in film thickness of 200 nm to form an organic electroluminescence element.

TABLE 1

| Constitution of Element | | | | | Luminescent Spectrum Characteristics | | |
|---|---|---|---|---|---|---|---|
| Hole-Transporting Layer | Luminescent Layer | Voltage at Start of Luminescence (V) | Luminance at 10 mA/cm² (cd/m²) | Luminance at 100 mA/cm² (cd/m²) | Luminescent Peak (nm) | Half Value Width (nm) | Half Value Period of Initial Luminance of 100 cd/m² |
| Cpd. (1-1) | Cpd. (2-10) | 4.0 | 360 | 2,200 | 452 | 84 | 185 hrs. |
| Cpd. (1-2) | Cpd. (2-10) | 4.0 | 380 | 2,300 | 454 | 105 | 210 hrs. |
| Cpd. (1-3) | Cpd. (2-10) | 4.0 | 380 | 2,300 | 454 | 102 | 215 hrs. |
| Cpd. (1-12) | Cpd. (2-10) | 4.5 | 350 | 2,100 | 457 | 95 | 205 hrs. |
| Cpd. (1-16) | Cpd. (2-10) | 5.0 | 330 | 2,000 | 452 | 86 | 325 hrs. |
| Cpd. (1-17) | Cpd. (2-10) | 4.5 | 380 | 2,400 | 463 | 93 | 540 hrs. |
| Cpd. (1-22) | Cpd. (2-10) | 4.5 | 380 | 2,500 | 456 | 85 | 520 hrs. |
| Cpd. (1-23) | Cpd. (2-10) | 5.0 | 380 | 2,100 | 452 | 86 | 190 hrs. |
| Cpd. (1-26) | Cpd. (2-10) | 4.5 | 380 | 2,400 | 455 | 88 | 220 hrs. |
| Cpd. (1-27) | Cpd. (2-10) | 4.0 | 360 | 2,500 | 462 | 90 | 270 hrs. |

Cpd.: Exemplified Compound

COMPARATIVE EXAMPLE 1

Organic electroluminescence elements were prepared in the same manner as in Example 1. On thoroughly washed ITO (manufactured by Asahi Glass Co., Ltd., sheet resistance: 15 Ω), the aromatic amine compound disclosed in JP-A-5-234681, 4,4'-bis[N-(1-naphthyl)-N-phenylamino] biphenyl (hereinafter referred to as "α-NPD") was deposited from the board made of tantalum at depositing rate of from Continuous driving test was carried out in the same manner as in Example 1 for measuring luminance characteristics, luminescent spectrum, and driving life. The results of evaluation obtained are shown in Table 2. Luminance characteristics and driving life of the elements prepared using each exemplified compound according to the present invention (Table 1) largely exceeded those in Comparative Example 1 (Table 2).

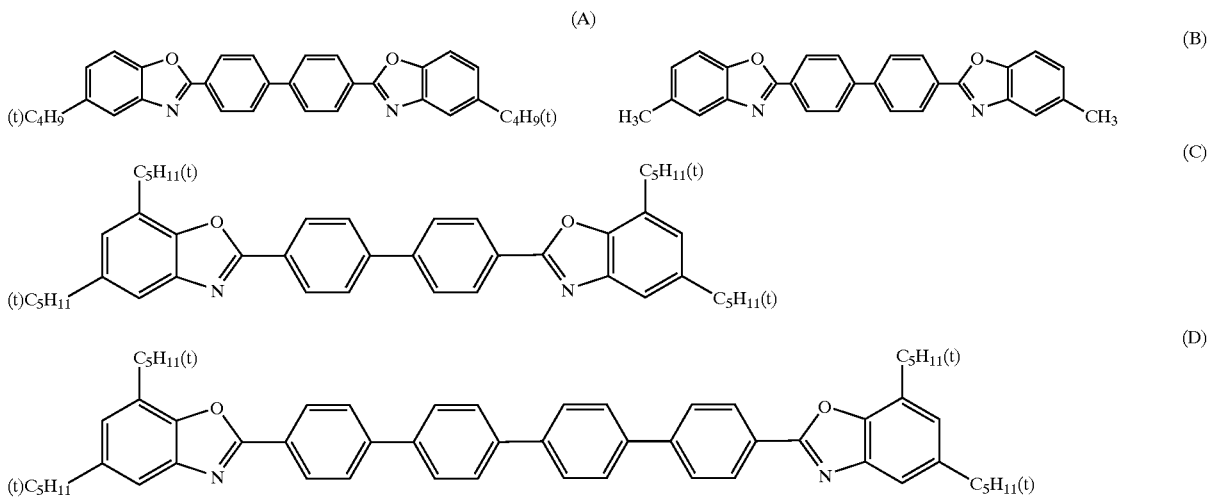

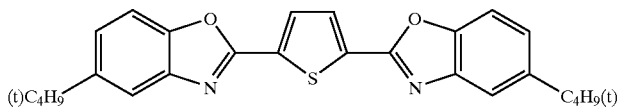

(E)

TABLE 2

| Constitution of Element | | Voltage at Start of Luminescence (V) | Luminance at 10 mA/cm² (cd/m²) | Luminance at 100 mA/cm² (cd/m²) | Luminescent Spectrum Characteristics | | Half Value Period of Initial Luminance of 100 cd/m² |
|---|---|---|---|---|---|---|---|
| Hole-Transporting Layer | Luminescent Layer | | | | Luminescent Peak (nm) | Half Value Width (nm) | |
| α-NPD | Cpd. (A) | Not luminescent | — | — | — | — | — |
| α-NPD | Cpd. (B) | Not luminescent | — | — | — | — | — |
| α-NPD | Cpd. (C) | 6.0 | 110 | 800 | 496 | 60 | 40 min. |
| α-NPD | Cpd. (D) | 6.0 | 150 | 1,000 | 450 | 91 | 1 hr. |
| α-NPD | Cpd. (E) | 10.0 | 70 | 500 | 524 | 75 | 10 min. |

Cpd.: Compound

COMPARATIVE EXAMPLE 2

Organic electroluminescence elements were prepared in the same manner as in Example 1. On thoroughly washed ITO (manufactured by Asahi Glass Co., Ltd., sheet resistance: 15 Ω), each exemplified compound represented by formula (I) according to the present invention (as shown in Table 3) was deposited from the board made of tantalum at depositing rate of from 0.1 to 0.2 nm/sec in thickness of 50 nm, and Compound (C) was deposited thereon from the board made of tantalum at depositing rate of from 0.1 to 0.2 nm/sec in thickness of 60 nm. Further, Al-Li alloy (manufactured by Ko-Jundo Kagaku Co., Ltd., Li concentration: 15 at %) was deposited thereon from the board made of tungsten at depositing rate of 0.5 nm/sec in film thickness of 200 nm to form an organic electroluminescence element. Continuous driving test was carried out in the same manner as in Example 1 for measuring luminance characteristics, luminescent spectrum, and driving life. The results of evaluation obtained are shown in Table 3. Luminance characteristics and driving life of the elements prepared using each exemplified compound according to the present invention (Table 1) largely exceeded those in Comparative Example 2 (Table 3).

COMPARATIVE EXAMPLE 3

Organic electroluminescence element was prepared in the same manner as in Example 1. On thoroughly washed ITO (manufactured by Asahi Glass Co., Ltd., sheet resistance: 15 Ω), α-NPD was deposited from the board made of tantalum at depositing rate of from 0.1 to 0.2 nm/sec in thickness of 50 nm, and exemplified Compound (2-10) was deposited thereon from the board made of tantalum at depositing rate of from 0.1 to 0.2 nm/sec in thickness of 60 nm. Further, Al-Li alloy (manufactured by Ko-Jundo Kagaku Co., Ltd., Li concentration: 15 at %) was deposited thereon from the board made of tungsten at depositing rate of 0.5 nm/sec in film thickness of 200 nm to form an organic electroluminescence element. Continuous driving test was carried out in the same manner as in Example 1 for measuring luminance characteristics, luminescent spectrum, and driving life. The results of evaluation obtained are shown in Table 4. Luminance characteristics and driving life of the elements prepared using each exemplified compound according to the present invention (Table 1) largely exceeded those in Comparative Example 3 (Table 4).

TABLE 3

| Constitution of Element | | Voltage at Start of Luminescence (V) | Luminance at 10 mA/cm² (cd/m²) | Luminance at 100 mA/cm² (cd/m²) | Luminescent Spectrum Characteristics | | Half Value Period of Initial Luminance of 100 cd/m² |
|---|---|---|---|---|---|---|---|
| Hole-Transporting Layer | Luminescent Layer | | | | Luminescent Peak (nm) | Half Value Width (nm) | |
| Cpd. (1-1) | Cpd. (C) | 6.0 | 120 | 850 | 494 | 63 | 2 hrs. |
| Cpd. (1-2) | Cpd. (C) | 6.0 | 110 | 800 | 488 | 66 | 3 hrs. |
| Cpd. (1-3) | Cpd. (C) | 6.0 | 110 | 800 | 487 | 65 | 3 hrs. |
| Cpd. (1-12) | Cpd. (C) | 7.0 | 100 | 700 | 483 | 70 | 2.5 hrs. |
| Cpd. (1-16) | Cpd. (C) | 6.0 | 100 | 700 | 471 | 72 | 4 hrs. |
| Cpd. (1-17) | Cpd. (C) | 7.5 | 120 | 900 | 456 | 66 | 6.5 hrs. |
| Cpd. (1-22) | Cpd. (C) | 7.0 | 120 | 900 | 462 | 62 | 6 hrs. |
| Cpd. (1-23) | Cpd. (C) | 6.0 | 130 | 1,000 | 468 | 67 | 2 hrs. |
| Cpd. (1-26) | Cpd. (C) | 6.5 | 120 | 950 | 477 | 63 | 2.5 hrs. |
| Cpd. (1-27) | Cpd. (C) | 6.5 | 120 | 900 | 479 | 70 | 4 hrs. |

Cpd.: Exemplified Compound or Compound

TABLE 4

| Constitution of Element | | Voltage at Start of Luminescence (V) | Luminance at 10 mA/cm² (cd/m²) | Luminance at 100 mA/cm² (cd/m²) | Luminescent Spectrum Characteristics | | Half Value Period of Initial Luminance of 100 cd/m² |
|---|---|---|---|---|---|---|---|
| Hole-Transporting Layer | Luminescent Layer | | | | Luminescent Peak (nm) | Half Value Width (nm) | |
| α-NPD | Cpd. (2-10) | 5.0 | 300 | 1,800 | 461 | 83 | 2 hrs. |

Cpd: Exemplified Compound

EXAMPLE 2

Organic electroluminescence elements were prepared using exemplified compounds represented by formula (I) according to the present invention as a hole-transporting layer and compounds represented by formula (II), (III) or (IV) as a dopant in a luminescent layer. The host materials were appropriately selected taking the excitation wavelength of the dopant and the ionization potential value into consideration. As the organic electroluminescence elements according to the present invention have the constitution in which the luminescent layer contains at least one organic compound represented by formula (II), (III) or (IV), the compounds to be used in combination can also be selected from among well-known compounds. On thoroughly washed ITO (manufactured by Asahi Glass Co., Ltd., sheet resistance: 15 Ω), each exemplified compound represented by formula (I) according to the present invention (as shown in Table 5) was deposited from the board made of tantalum at depositing rate of from 0.1 to 0.2 nm/sec in thickness of 50 nm, and dopant material, Compound (X), and host material, Compound (Y), were co-deposited thereon from the board made of tantalum at depositing rate of Compound (X) of from 0.01 to 0.05 nm/sec and Compound (Y) of from 0.5 to 2.5 nm/sec until the thickness of the host material reached 20 nm. The ratio of depositing rate was adjusted such that the concentration of dopant Compound (X) became 0.5 mol % in host Compound (Y). The host material was further deposited on the co-deposition layer in thickness of 40 nm. Further, Al-Li alloy (manufactured by Ko-Jundo Kagaku Co., Ltd., Li concentration: 15 at %) was deposited thereon from the board made of tungsten at depositing rate of 0.5 nm/sec in film thickness of 200 nm to form an organic electroluminescence element. Materials of hole-transporting layer and the combination of dopant material (X) and host material (Y) are shown in Table 5. Characteristic of voltage, luminance, and electric current of each element were measured using BM-8 luminescent meter manufactured by Top-con Co., Ltd., source measuring unit 236 manufactured by Keithley Instruments Inc as the electric source, and the positive electrode was connected to ITO and the negative electrode to the cathode. Luminescent spectrum of each element was measured using LS-50B manufactured by Perkin Elmer Co., Ltd. Further, for measuring driving life of elements, each element was connected to a constant current electric source (source measuring unit 236 manufactured by Keithley Instruments Inc), and continuous driving test of each element was conducted. As driving conditions of the continuous driving test, the electric current value was set such that the initial luminance of the element having a luminescent area of 8 mm² became 100 cd/m² by constant current driving. Evaluation was carried out taking the time required for the initial luminance of the element to become half as half value period. The results obtained are shown in Table 5 below.

TABLE 5

| Hole Transporting Layer | Compound Constituting Luminescent Layer | | Voltage at Start of Luminescence (V) | Luminance at 10 mA/cm² (cd/m²) | Luminance at 100 mA/cm² (cd/m²) | Luminescent Spectrum Characteristics | | Half Value Period of Initial Luminance of 100 cd/m² |
|---|---|---|---|---|---|---|---|---|
| | Dopant Material (X) | Host Material (Y) | | | | Luminescent Peak (nm) | Half Value Width (nm) | |
| Cpd. (1-2) | Cpd. (2-22) | Cpd. (2-13) | 4.0 | 1,100 | 9,400 | 477 | 75 | 2,100 hrs. |
| Cpd. (1-17) | Cpd. (2-22) | Cpd. (2-13) | 4.5 | 1,200 | 9,500 | 474 | 80 | 3,300 hrs. |
| Cpd. (1-27) | Cpd. (3-3) | Cpd. (2-13) | 4.0 | 1,300 | 9,600 | 475 | 77 | 1,800 hrs. |
| Cpd. (1-2) | Cpd. (3-6) | Cpd. (2-10) | 4.0 | 1,000 | 8,400 | 487 | 61 | 1,800 hrs. |
| Cpd. (1-17) | Cpd. (2-22) | Cpd. (2-10) | 4.5 | 1,100 | 8,600 | 479 | 66 | 2,300 hrs. |
| Cpd. (1-2) | Cpd. (2-22) | Cpd. (C) | 3.5 | 600 | 5,500 | 498 | 79 | 550 hrs. |
| Cpd. (1-17) | Cpd. (4-7) | Cpd. (C) | 5.0 | 550 | 5,200 | 492 | 74 | 300 hrs. |

Cpd: Exemplified Compound

COMPARATIVE EXAMPLE 4

Organic electroluminescence element was prepared in the same manner as in Example 2. On thoroughly washed ITO (manufactured by Asahi Glass Co., Ltd., sheet resistance: 15 Ω), α-NPD was deposited from the board made of tantalum at depositing rate of from 0.1 to 0.2 nm/sec in thickness of 50 nm, and the above Compound (C) was deposited thereon as host material and the above Compound (E) as dopant material to form an organic electroluminescence element comprising a luminescent layer. Continuous driving test was carried out in the same manner as in Example 2 for measuring luminance characteristics, luminescent spectrum, and driving life. The results of evaluation obtained are shown in Table 6. Luminance characteristics and driving life of the elements prepared according to the constitution of the present invention (Table 5) largely exceeded those in Comparative Example 4 (Table 6).

TABLE 6

| Compound Constituting Luminescent Layer | | | | | Luminescent Spectrum Characteristics | | | |
|---|---|---|---|---|---|---|---|---|
| Hole Transporting Layer | Dopant Material (X) | Host Material (Y) | Voltage at Start of Luminescence (V) | Luminance at 10 mA/cm$^2$ (cd/m$^2$) | Luminance at 100 mA/cm$^2$ (cd/m$^2$) | Luminescent Peak (nm) | Half Value Width (nm) | Half Value Period of Initial Luminance of 100 cd/m$^2$ |
| α-NPD | Cpd. (E) | Cpd. (C) | 9.0 | 50 | 380 | 472 | 103 | 10 min. |

Cpd: Compound

EXAMPLE 3

Organic electroluminescence elements were prepared using aromatic tertiary amine compounds represented by formula (Ia), (Ib) or (Ic) as a hole-transporting layer. On thoroughly washed ITO (manufactured by Asahi Glass Co., Ltd., sheet resistance: 15 Ω), each exemplified compound represented by formula (Ia), (Ib) or (Ic) according to the present invention (as shown in Table 7) was deposited from the board made of tantalum at depositing rate of from 0.1 to 0.2 nm/sec in thickness of 50 nm, and Alq (tris(8-quinolinol)aluminum) was vacuum deposited thereon from the board made of tantalum at depositing rate of from 0.1 to 0.2 nm/sec in thickness of 75 nm. Further, Al-Li alloy (Li concentration: 15 at %) was vacuum deposited thereon from the board made of tungsten at depositing rate of 0.5 nm/sec in film thickness of 200 nm to form an Al-Li layer, thus an organic electroluminescence element was prepared. Continuous driving test was carried out by driving the completed element having a luminescent area of 8 mm$^2$ by constant current in dry nitrogen gas. As driving conditions, the electric current value was adjusted such that the initial luminance of the element became 500 cd/m$^2$. Evaluation was carried out taking the time required for the initial luminance of the element to become half by DC constant current driving as half value period. Luminance was measured using BM-8 luminescent meter manufactured by Topcon Co., Ltd. The results of the evaluation obtained are shown in Table 7 below.

TABLE 7

| Hole-Transporting Layer Hole-Transporting Material | Initial Driving Condition | | Half Value Period of Initial Luminance of 500 cd/m$^2$ |
|---|---|---|---|
| | Driving Voltage (V) | Driving Electric Current (mA/cm$^2$) | |
| Cpd. (1-1) | 10.2 | 11.2 | 234 hrs. |
| Cpd. (1-2) | 10.6 | 15.5 | 354 hrs. |
| Cpd. (1-3) | 10.3 | 15.0 | 425 hrs. |
| Cpd. (1-11) | 10.2 | 11.5 | 95 hrs. |
| Cpd. (1-12) | 11.3 | 14.2 | 390 hrs. |
| Cpd. (1-16) | 10.4 | 12.5 | 870 hrs. |
| Cpd. (1-17) | 10.8 | 12.1 | 1,150 hrs. |
| Cpd. (1-22) | 11.1 | 12.3 | 1,240 hrs. |
| Cpd. (1-23) | 12.2 | 11.2 | 195 hrs. |
| Cpd. (1-26) | 10.8 | 12.2 | 180 hrs. |
| Cpd. (1-27) | 11.5 | 11.8 | 260 hrs. |

Cpd: Exemplified Compound

COMPARATIVE EXAMPLE 5

Organic electroluminescence elements were prepared in the same manner as in Example 3. On thoroughly washed ITO (manufactured by Asahi Glass Co., Ltd., sheet resistance: 15 Ω), well-known compound, TPD, and α-NPD were each deposited from the board made of tantalum at depositing rate of from 0.1 to 0.2 nm/sec in thickness of 50 nm, and Alq. (tris(8-quinolinol)aluminum) was vacuum deposited thereon from the board made of tantalum at depositing rate of from 0.1 to 0.2 nm/sec in thickness of 75 nm. Further, Al-Li alloy (Li concentration: 15 at%) was vacuum deposited thereon from the board made of tungsten at depositing rate of 0.5 nm/sec in film thickness of 200 nm to form an Al-Li layer, thus an organic electroluminescence element was prepared. In the same manner as in Example 3, continuous driving test was carried out by driving the completed element having a luminescent area of 8 m$^2$ by constant current in dry nitrogen gas. As driving conditions, the electric current value was adjusted such that the initial luminance of the element became 500 cd/m$^2$. Evaluation was carried out taking the time required for the initial luminance of the element to become half by DC constant current driving as half value period. Luminance was measured using BM-8 luminescent meter manufactured by Topcon Co., Ltd. The results of the evaluation obtained are shown in Table 8 below. Driving life of the elements prepared according to the constitution of the present invention (Table 7) largely exceeded those in Comparative Example 5 (Table 8).

TABLE 8

| Hole-Transporting Layer Hole-Transporting Material | Initial Driving Condition | | Half Value Period of Initial Luminance of 500 cd/m$^2$ |
|---|---|---|---|
| | Driving Voltage (V) | Driving Electric Current (mA/cm$^2$) | |
| TPD | 10.3 | 10.5 | 90 hrs. |
| α-NPD | 11.2 | 13.8 | 60 hrs. |

EFFECT OF THE INVENTION

As described above, due to the use of the organic compounds according to the present invention, the present invention can provide an organic electroluminescence element having high luminescent efficacy and high stability. Above all, by using the organic compounds according to the present invention in the organic compound layer between the anode and the cathode, i.e., by the use of the exemplified compound represented by formula (I) in the hole-transporting layer and the organic compound represented by formula (II), (III) or (IV) in the luminescent layer, or in the electron-transporting layer between the luminescent layer and the cathode, the present invention can provide an organic electroluminescence element having high luminescent efficacy and high stability.

Further, when the aromatic tertiary amine compound represented by formula (Ia), (Ib) or (Ic) is used as the hole-transporting layer, the obtained organic electroluminescence element exhibits markedly prolonged driving life and excellent stability as compared with conventional organic electroluminescence elements. Due to the element constitution according to the present invention, the practicability of an organic electroluminescence element in display units has been conspicuously increased.

While the invention has been described in detail and with reference to specific examples thereof, it will be apparent to one skilled in the art that various changes and modifications can be made therein without departing from the spirit and scope thereof.

What is claimed is:

1. An organic electroluminescence element comprising a substrate having provided thereon an anode for injecting holes, a cathode for injecting electrons, and at least one organic compound layer therebetween, wherein said at least one organic compound layer contains at least one compound represented by formula (I), and at least one compound represented by formula (II), (III) or (IV), wherein the at least one compound represented by formula (I) and the at least one compound represented by formula (II), (III) or (IV) can be in the same or different layers:

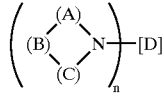
(I)

wherein (A), (B) and (C) each represents a substituted or unsubstituted o-arylene, vinylene or ethylene group; [D] represents a group derived from a compound containing at least one aromatic group; and n represents an integer of 1 or more;

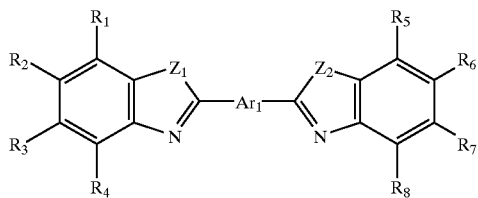
(II)

wherein $R_1$, $R_2$, $R_3$, $R_4$, $R_5$, $R_6$, $R_7$ and $R_8$ each represents a hydrogen atom or a substitutable group, and at least one of $R_1$ to $R_8$ represents an alkoxyl group, an aryloxy group, a dialkylamino group, an N-alkyl-N-arylamino group, or a diarylamino group; $Ar_1$ represents a divalent group derived from benzene, naphthalene, anthracene, or an aromatic heterocyclic ring, or an aromatic hydrocarbon ring assembly; and $Z_1$ and $Z_2$ each represents an oxygen atom, a sulfur atom or a mono-substituted nitrogen atom;

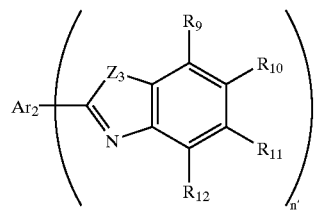
(III)

wherein $R_9$, $R_{10}$, $R_{11}$, and $R_{12}$ each represents a hydrogen atom or a substitutable group; $Ar_2$ represents a group derived from benzene, naphthalene, anthracene, or an aromatic heterocyclic ring, or an aromatic ring assembly; $Z_3$ represents an oxygen atom, a sulfur atom or a mono-substituted nitrogen atom; and n' represents an integer of 3 or 4;

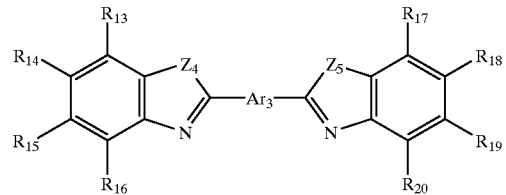
(IV)

wherein $R_{13}$, $R_{14}$, $R_{15}$, $R_{16}$, $R_{17}$, $R_{18}$, $R_{19}$ and $R_{20}$ each represents a hydrogen atom or a substitutable group; $Ar_3$ represents a divalent group derived from an aromatic ring assembly containing at least one aromatic heterocyclic ring; and $Z_4$ and $Z_5$ each represents an oxygen atom, a sulfur atom or a mono-substituted nitrogen atom.

2. The organic electroluminescence element as claimed in claim 1, wherein said organic compound layer comprises a luminescent layer having a luminescent region and the luminescent layer contains at least one compound represented by formula (II), (III) or (IV).

3. The organic electroluminescence element as claimed in claim 2, wherein said luminescent layer comprises at least two organic compounds and at least one of these two organic compounds is a compound represented by formula (II), (III) or (IV).

4. The organic electroluminescence element as claimed in claim 1 or 2, wherein said organic compound layer comprises a hole-transporting layer which transports holes and the hole-transporting layer contains at least one compound represented by formula (I).

5. The organic electroluminescence element as claimed in claim 1 or 2, wherein said organic compound layer comprises an electron-transporting layer which transports electrons and the electron-transporting layer contains at least one compound represented by formula (II), (III) or (IV).

6. The organic electroluminescence element as claimed in claim 1, wherein said organic compound layer comprises a polymer dispersion layer having at least one compound represented by the formula (I), (II), (III), or (IV) dispersed in a polymer compound.

7. The organic electroluminescence element as claimed in claim 4, wherein said hole-transporting layer comprises a polymer dispersion layer having at least one compound represented by formula (I) dispersed in a polymer compound.

* * * * *